US012660244B2

(12) United States Patent
Chang et al.

(10) Patent No.: US 12,660,244 B2
(45) Date of Patent: Jun. 16, 2026

(54) INTEGRATED CIRCUIT STRUCTURE WITH BACKSIDE VIA

(71) Applicant: TAIWAN SEMICONDUCTOR MANUFACTURING COMPANY, LTD., Hsinchu (TW)

(72) Inventors: Che-Lun Chang, Hsinchu (TW); Wei-Yang Lee, Taipei City (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 854 days.

(21) Appl. No.: 17/881,420

(22) Filed: Aug. 4, 2022

(65) Prior Publication Data

US 2024/0047546 A1    Feb. 8, 2024

(51) Int. Cl.
| | |
|---|---|
| *H10D 30/67* | (2025.01) |
| *H10D 62/10* | (2025.01) |
| *H10D 64/01* | (2025.01) |
| *H10D 64/23* | (2025.01) |
| *H10P 50/00* | (2026.01) |

(52) U.S. Cl.
CPC ..... *H10D 30/6735* (2025.01); *H10D 30/6757* (2025.01); *H10D 62/121* (2025.01); *H10D 64/01* (2025.01); *H10D 64/017* (2025.01); *H10D 64/258* (2025.01); *H10P 50/691* (2026.01)

(58) Field of Classification Search
CPC ........... H10D 30/6735; H10D 30/6757; H10D 62/121; H10D 64/01; H10D 64/017;
H10D 64/258; H10D 30/797; H10D 30/014; H10D 62/364; H10D 62/82; H10D 62/822; H10D 30/0198; H10D 30/43; H10D 62/151; H10D 64/256; H10D 84/0149; H10D 84/038; H10D 84/83; H01L 21/308; H01L 21/76897; H01L 23/5286; H01L 21/0245; H01L 21/02532; H01L 21/0262; H01L 21/02636; B82Y 10/00; H10P 50/691; H10P 14/24; H10P 14/27; H10P 14/3211; H10P 14/3411; H10W 20/069; H10W 20/0696; H10W 20/427; H10W 20/481
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Jonathan Han
(74) *Attorney, Agent, or Firm* — Maschoff Brennan

(57) ABSTRACT

An integrated circuit (IC) structure includes a gate structure, source/drain epitaxial structures, a front-side interconnection structure, a backside dielectric layer, and a backside via. The source/drain epitaxial structures are respectively on opposite sides of the gate structure. The front-side interconnection structure is on front-sides of the source/drain epitaxial structures. The backside dielectric layer is on backsides of the source/drain epitaxial structures. The backside via extends through the backside dielectric layer to one of the source/drain epitaxial structures, and has a maximal lateral dimension larger than a lateral dimension of the source/drain epitaxial structure.

20 Claims, 31 Drawing Sheets

(56)　　　　　References Cited

U.S. PATENT DOCUMENTS

| | | | |
|---|---|---|---|
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0336012 | A1* | 10/2021 | Huang ................. H10D 62/116 |
| 2021/0359091 | A1* | 11/2021 | Hsu .................... H10D 30/6757 |
| 2021/0376094 | A1* | 12/2021 | Lin ...................... H10D 84/038 |

* cited by examiner

100

100

100

100

100

100

200

100

100

100

100

100

100

100

100

100

100

100

100

100

300

302 { 307 — 306
308 — 304

302 { 307 — 306
308 — 304

301 { 305 — 303

272 —
282 —
292

170 — 194
124 —
170 —   190S   190D   190S
124 —
170 —
124 —
226
224
222
222
224
226  } 220

210 —
200 —   253
256 —
255 —   254
256 —   253   } 250
255 —   254

260 —   250

226 224 222 } 220

S    D    S

INTEGRATED CIRCUIT STRUCTURE WITH BACKSIDE VIA

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
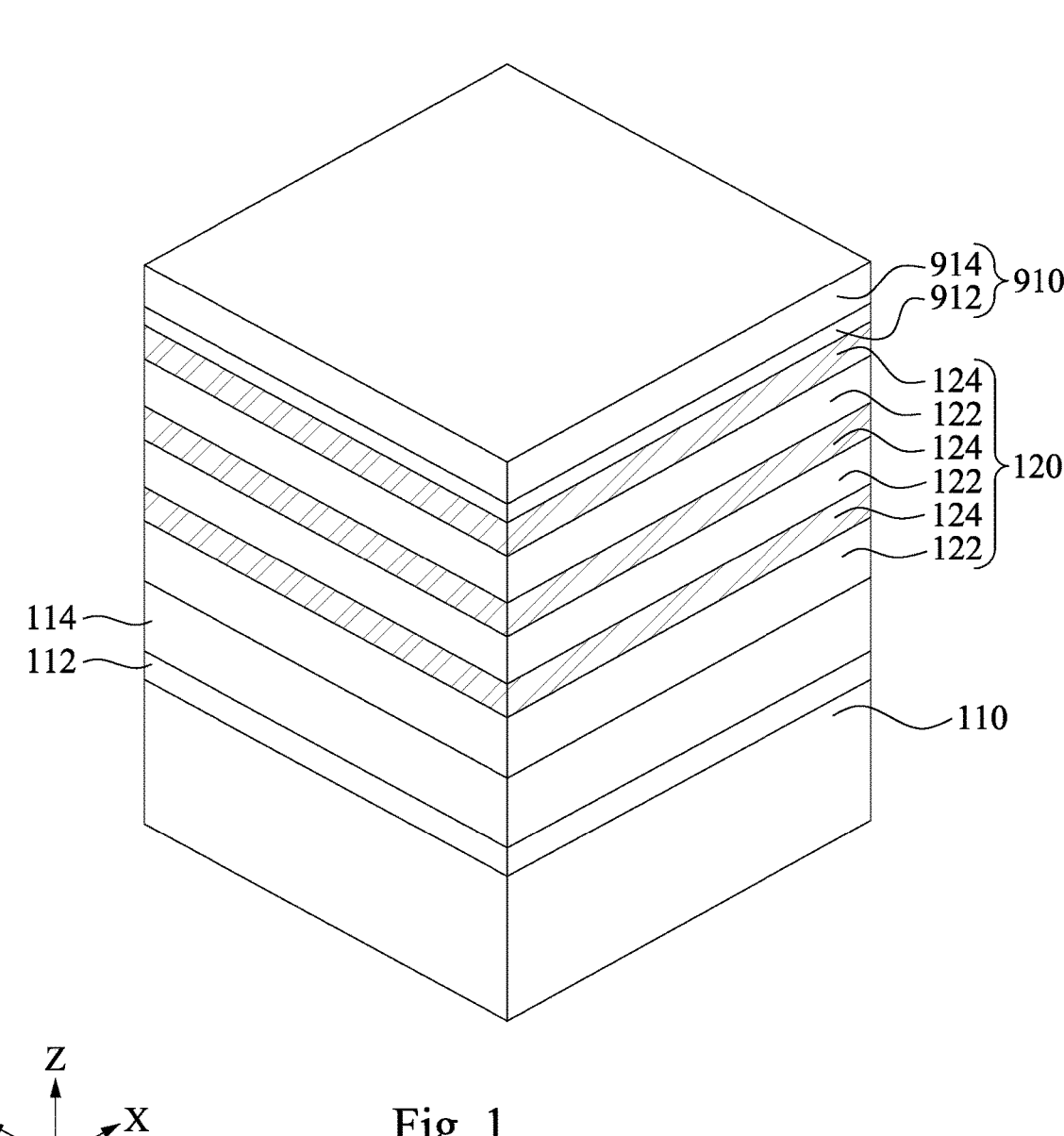
FIGS. 1, 2, 3, 4A, 5A, 6A and 7A are perspective views of some embodiments of an integrated circuit structure at intermediate stages of the IC fabrication method.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating gate-all-around (GAA) transistors with backside vias below source regions and/or drain regions of the GAA transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FIN-FET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel (s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In order to create more routing space for an integrated circuit (IC) structure having a large number of GAA transistors, backside power rails connected to backside of source regions of GAA transistors using backside metal vias are being studied as an alternative to front-side power rails formed on front-side of source regions of transistors. Dimensions of the backside metal vias depend on sacrificial silicon germanium (SiGe) plugs formed in the substrate under the source regions. As the transistors scale down, the sacrificial SiGe plugs scale down as well, which in turn reduces contact area of backside metal via. Resistance capacitance (RC) time delay is thus increased due to limited contact area of the backside metal vias, thereby degrading device performance of GAA transistors. The present disclosure, in various embodiments, provides an additional SiGe insertion layer on the substrate. The SiGe insertion layer can be laterally recessed during etching the sacrificial SiGe plugs, which in turn increases lateral dimension of backside via openings, which in turn reduces the contact area of the backside metal vias, thus improving the RC delay performance.

Illustrated in FIGS. 1-26 is a method of IC fabrication including fabrication of an integrated circuit structure having multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 1, 2, 3, 4A, 5A, 6A and 7A are perspective views of some embodiments of an integrated circuit structure 100 at intermediate stages of the IC fabrication method. FIGS. 4B, 5B, 6B, 7B, 8-12, 13A, and 14-26 are cross-sectional views of some embodiments of the integrated circuit structure 100 at intermediate stages of the IC fabrication method along a first cut (e.g., cut X-X in FIG. 4A), which is along a lengthwise direction of the channel and perpendicular to a top surface of the substrate. FIG. 13B is a cross-sectional view of some embodiments of the integrated circuit structure 100 at intermediate stages of the IC fabrication method along a second cut (e.g., cut Y-Y in FIG. 4A), which is in the gate region and perpendicular to the lengthwise direction of the channel.

As with the other method embodiments and exemplary devices discussed herein, it is understood that parts of the integrated circuit structure 100 may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected. Moreover, it is noted that the process steps of IC fabrication method, including any descriptions given with reference to FIGS. 1-26, as with the remainder of the method and exemplary figures provided in this disclosure, are merely exemplary and are not intended to be limiting beyond what is specifically recited in the claims that follow.

In FIG. 1, a first semiconductor layer 112 is formed over a substrate 110, and a second semiconductor layer 114 is formed over the first semiconductor layer. The auxiliary semiconductor layer 112 has a different material than the substrate 100 and the second semiconductor layer. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

In some embodiments where the substrate 110 is Si, the first semiconductor layer 112 is SiGe, and the second semiconductor layer 114 is Si. In particular, the second semiconductor layer 114 is germanium-free. The first semiconductor layer 112 is thus interchangeably referred to as a SiGe insertion layer embedded within a Si structure comprising the Si substrate 110 and the Si layer 114. In some embodiments, the Si layer 114 is thicker than the SiGe insertion layer 112, and the Si layer 114 can be interchangeably referred to as a thick Si layer 114 in this context. In some embodiments, a thickness of the Si layer 114 is at least twice, triple, quadruple a thickness of the SiGe insertion layer 112, or more. In some embodiments, a thickness ratio of the thick Si layer 114 to the SiGe insertion layer 112 is in a range from about 3 to about 7. For example, the SiGe insertion layer 112 has a thickness in a range from about 5 nm to about 30 nm, and the Si layer 114 has a thickness in a range from about 30 nm to about 90 nm. In some embodiments, the SiGe insertion layer 112 has a germanium atomic percentage in a range from about 15% to about 50%. The SiGe insertion layer 112 and the Si layer 114 may be formed by epitaxial growth by using, for example, a molecular beam epitaxy (MBE) process, a metalorganic chemical vapor deposition (MOCVD) process, and/or other suitable epitaxial growth processes.

FIG. 1 also illustrates an epitaxial stack 120 formed over the second semiconductor layer 114. The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below.

It is noted that three layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers. The epitaxial layers 122, 124 each have a thickness smaller than the thick Si layer 114.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110 and the second semiconductor layer 114. In some embodiments, the epitaxially grown layers 122 and 124 include a different material than the substrate 110 and the second semiconductor layer 114. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 cm$^{-3}$ to about $1\times10^{18}$ cm$^{-3}$), where for example, no intentional doping is performed during the epitaxial growth process.

Figure 2:
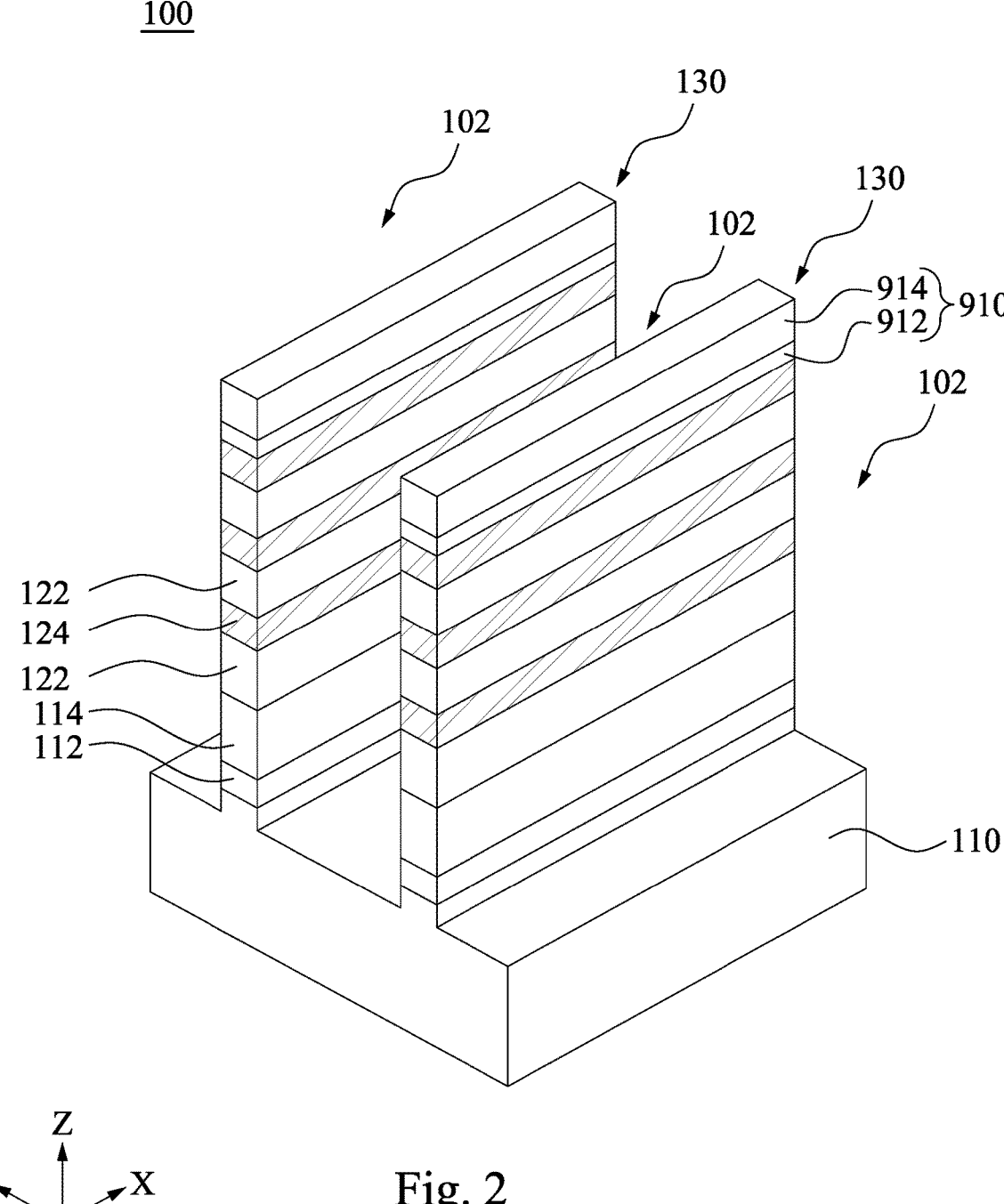

In FIG. 2, a plurality of semiconductor fins 130 are formed on the substrate 110. In various embodiments, each of the fins 130 includes a portion of substrate 110, a portion of SiGe insertion layer 112, a portion of Si layer 114, and portions of each of the epitaxial layers of the epitaxial stack including epitaxial layers 122 and 124. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120, Si layer 114, and SiGe insertion layer 112. The etching process can include dry etching, wet etching, reactive ion etching (RIE), and/or other suitable processes.

In the illustrated embodiment as illustrated in FIGS. 1 and 2, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches 102 in unprotected regions through the HM layer 910, through the epitaxial stack 120, the thick Si layer 114, and the SiGe insertion layer 112, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 3:
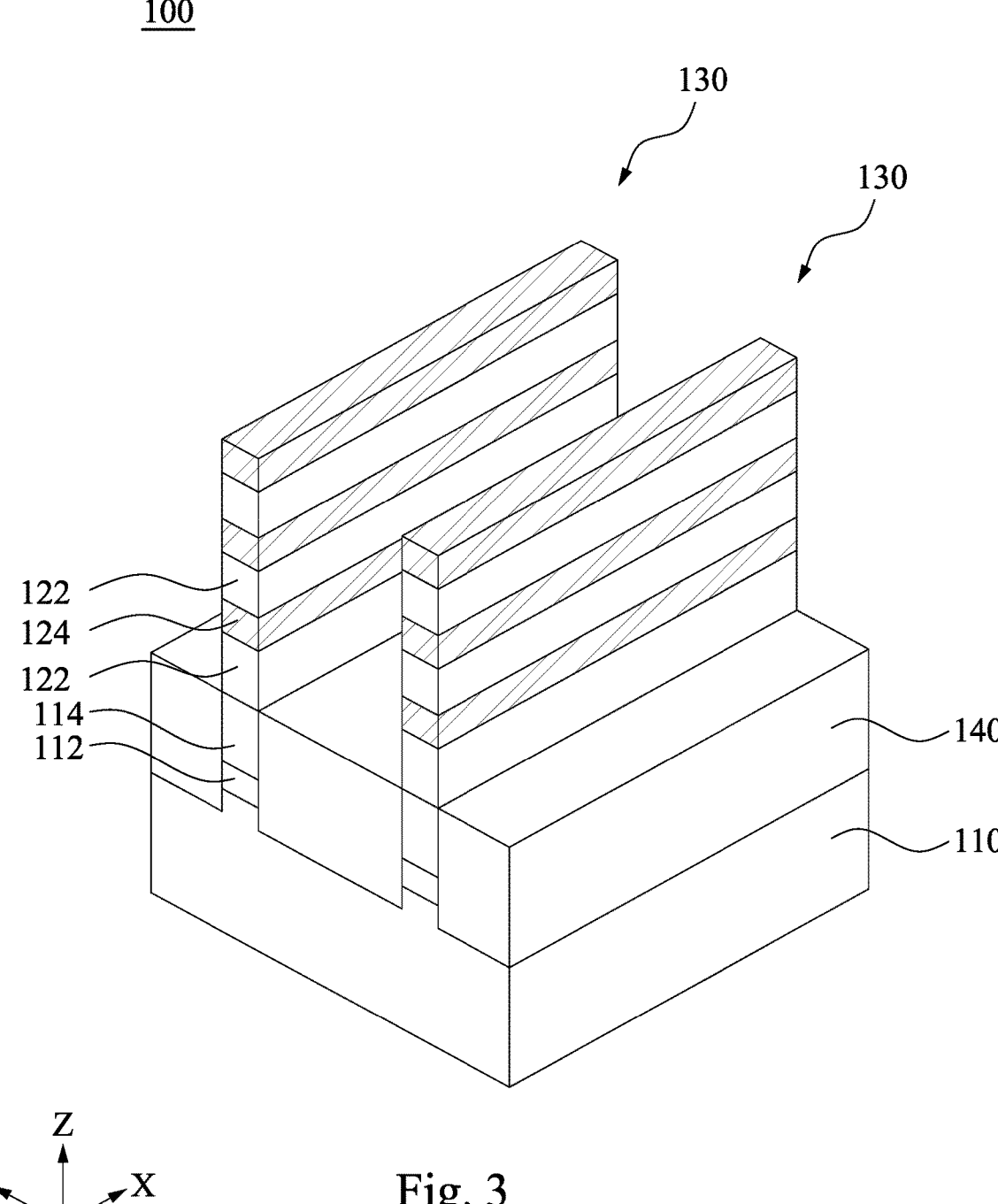

FIG. 3 illustrates formation of shallow trench isolation (STI) features 140 interposing the fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the integrated circuit structure 100 may be annealed, for example, to improve the quality of the dielectric layer. In some embodiments, the dielectric layer (and subsequently formed STI features 140) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 (as illustrated FIG. 2) functions as a CMP stop layer. The STI features 140 interposing the fins 130 are recessed. Referring to the example of FIG. 3, the STI features 140 are recessed providing the fins 130 extending above the STI features 140. In some embodiments, the recessing process may include a dry etching process, a wet etching process, and/or a combination thereof. The HM layer 910 may also be removed before, during, and/or after the recessing of the STI features 140. The nitride layer 914 of the HM layer 910 may be removed, for example, by a wet etching process using H₃PO₄ or other suitable etchants. In some embodiments, the oxide layer 912 of the HM layer 910 is removed by the same etchant used to recess the STI features 140. In some embodiments, a recessing depth is controlled (e.g., by controlling an etching time) so as to result in a desired height of the exposed upper portion of the fins 130. In the illustrated embodiment, the desired height exposes each of the layers of the epitaxial stack 120 in the fins 130, but does not expose the SiGe insertion layer 112.

Figure 4A:
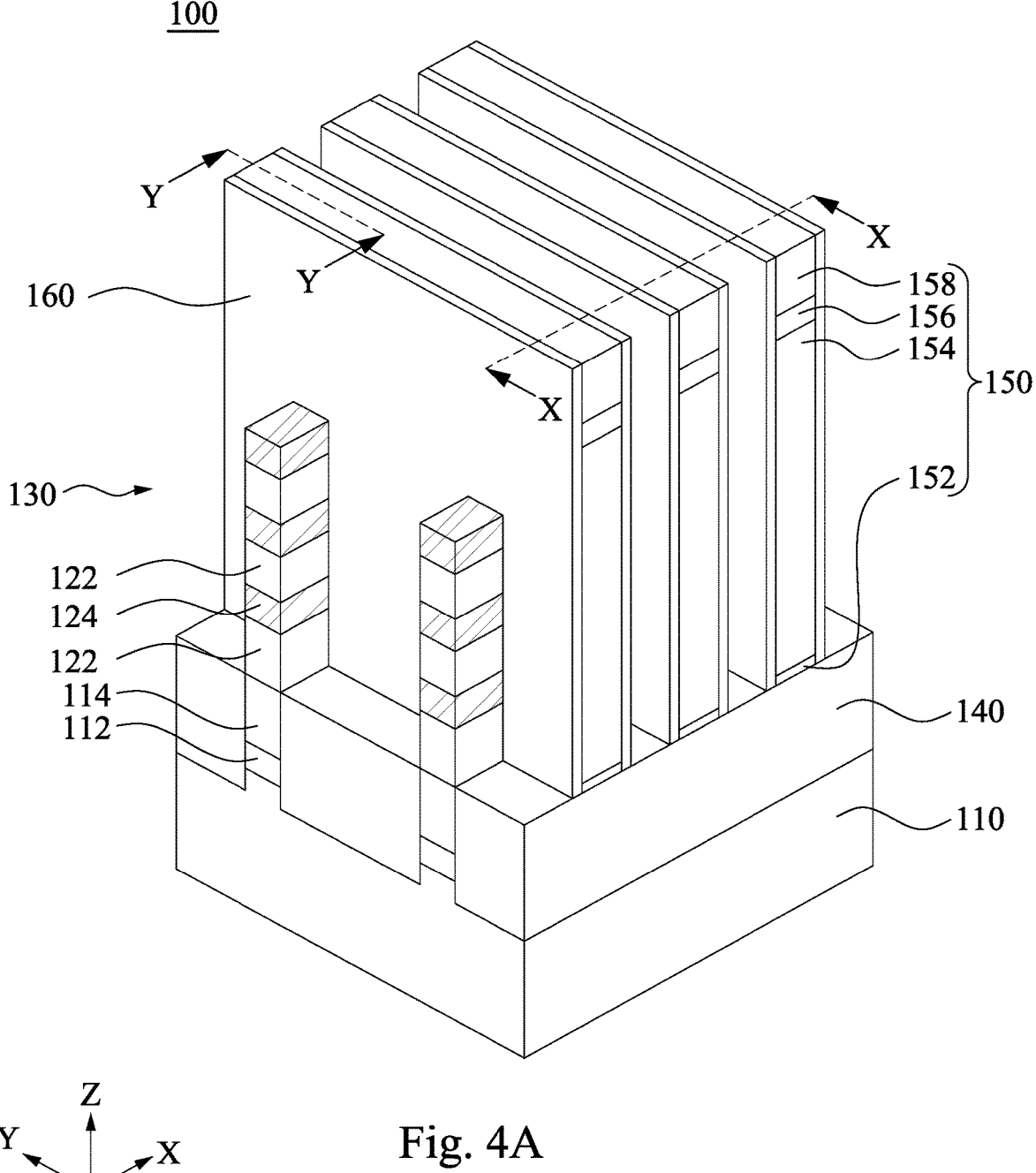
Figure 4B:
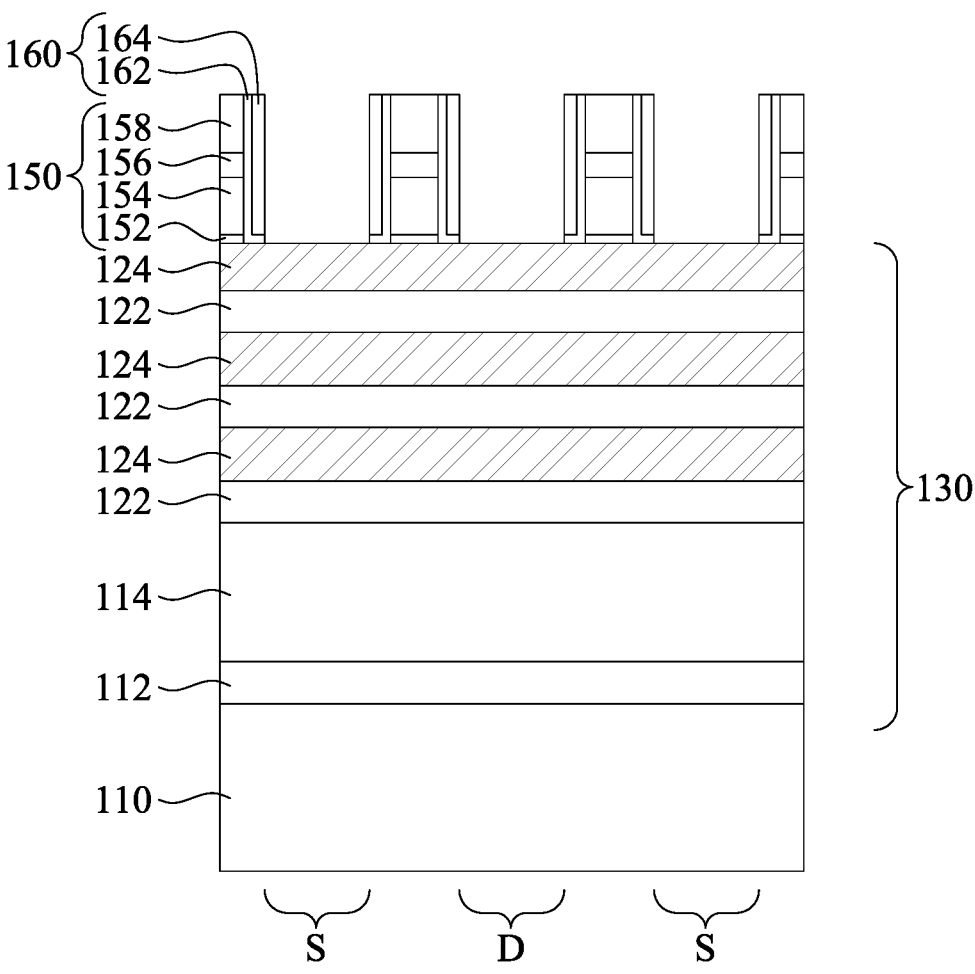
FIGS. 4B, 5B, 6B, 7B, 8-12, 13A, and 14-26 are cross-sectional views of some embodiments of the integrated circuit structure at intermediate stages of the IC fabrication method along a first cut (e.g., cut X-X in FIG. 4A), which is along a lengthwise direction of the channel and perpendicular to a top surface of the substrate.

In FIGS. 4A and 4B, a gate structure 150 is formed. In some embodiments, the gate structure 150 is a dummy (sacrificial) gate structure that is subsequently removed. Thus, in some embodiments using a gate-last process, the gate structure 150 is a dummy gate structure and will be replaced by the final gate structure at a subsequent processing stage of the integrated circuit structure 100. In particular, the dummy gate structure 150 may be replaced at a later processing stage by a high-k dielectric layer (HK) and metal gate electrode (MG) as discussed below. In some embodiments, the dummy gate structure 150 is formed over the substrate 110 and is at least partially disposed over the fins 130. The portion of the fins 130 underlying the dummy gate structure 150 may be referred to as the channel region. The dummy gate structure 150 may also define a source/drain (S/D) region of the fins 130, for example, the regions of the fin 130 adjacent and on opposing sides of the channel region.

In the illustrated embodiment, a dummy gate dielectric layer 152 is first formed over the fins 130. In some embodiments, the dummy gate dielectric layer 152 may include SiO₂, silicon nitride, a high-k dielectric material and/or other suitable material. In various examples, the dummy gate dielectric layer 152 may be deposited by a CVD process, a subatmospheric CVD (SACVD) process, a flowable CVD process, an ALD process, a PVD process, or other suitable process. By way of example, the dummy gate dielectric layer 152 may be used to prevent damages to the fins 130 by subsequent processes (e.g., subsequent formation of the dummy gate structure). Subsequently, other portions of the dummy gate structure 150, including a dummy gate electrode layer 154 and a hard mask which may include multiple layers 156 and 158 (e.g., an oxide layer 156 and a nitride layer 158), are formed. In some embodiments, the dummy gate structure 150 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 154 may include polycrystalline silicon (polysilicon). In some embodiments, the hard mask includes an oxide layer 156 such as a pad oxide layer that may include SiO₂, and a nitride layer 158 such as a pad nitride layer that may include Si₃N₄ and/or silicon oxynitride. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, the oxide layer 156 and the nitride layer 158.

FIGS. 4A and 4B also illustrate formation of gate spacers 160. In some embodiments, a spacer material layer is deposited on the substrate. The spacer material layer may be a conformal layer that is subsequently etched back to form gate sidewall spacers. In the illustrated embodiment, a spacer material layer 160 is disposed conformally on top and sidewalls of the dummy gate structure 150. The spacer material layer 150 may include a dielectric material such as silicon oxide, silicon nitride, silicon carbide, silicon oxynitride, SiCN films, silicon oxycarbide, SiOCN films, and/or combinations thereof. In some embodiments, the spacer material layer 160 includes multiple layers, such as a first spacer layer 162 and a second spacer layer 164 (illustrated in FIG. 4B) formed over the first spacer layer 162. By way of example, the spacer material layer 160 may be formed by depositing a dielectric material over the gate structure 150 using processes such as, CVD process, a subatmospheric CVD (SACVD) process, a flowable CVD process, an ALD process, a PVD process, or other suitable process. An anisotropic etching process is then performed on the deposited spacer material layer 160 to expose portions of the fins 130 not covered by the dummy gate structure 150 (e.g., in source/drain regions of the fins 130). Portions of the spacer material layer directly above the dummy gate structure 150 may be completely removed by this anisotropic etching process. Portions of the spacer material layer on sidewalls of the dummy gate structure 150 may remain, forming gate sidewall spacers, which are denoted as the gate spacers 160, for the sake of simplicity. It is noted that although the gate spacers 160 are multi-layer structures in the cross-sectional view of FIG. 4B, they are illustrated as single-layer structures in the perspective view of FIG. 4A for the sake of simplicity.

Figure 5A:
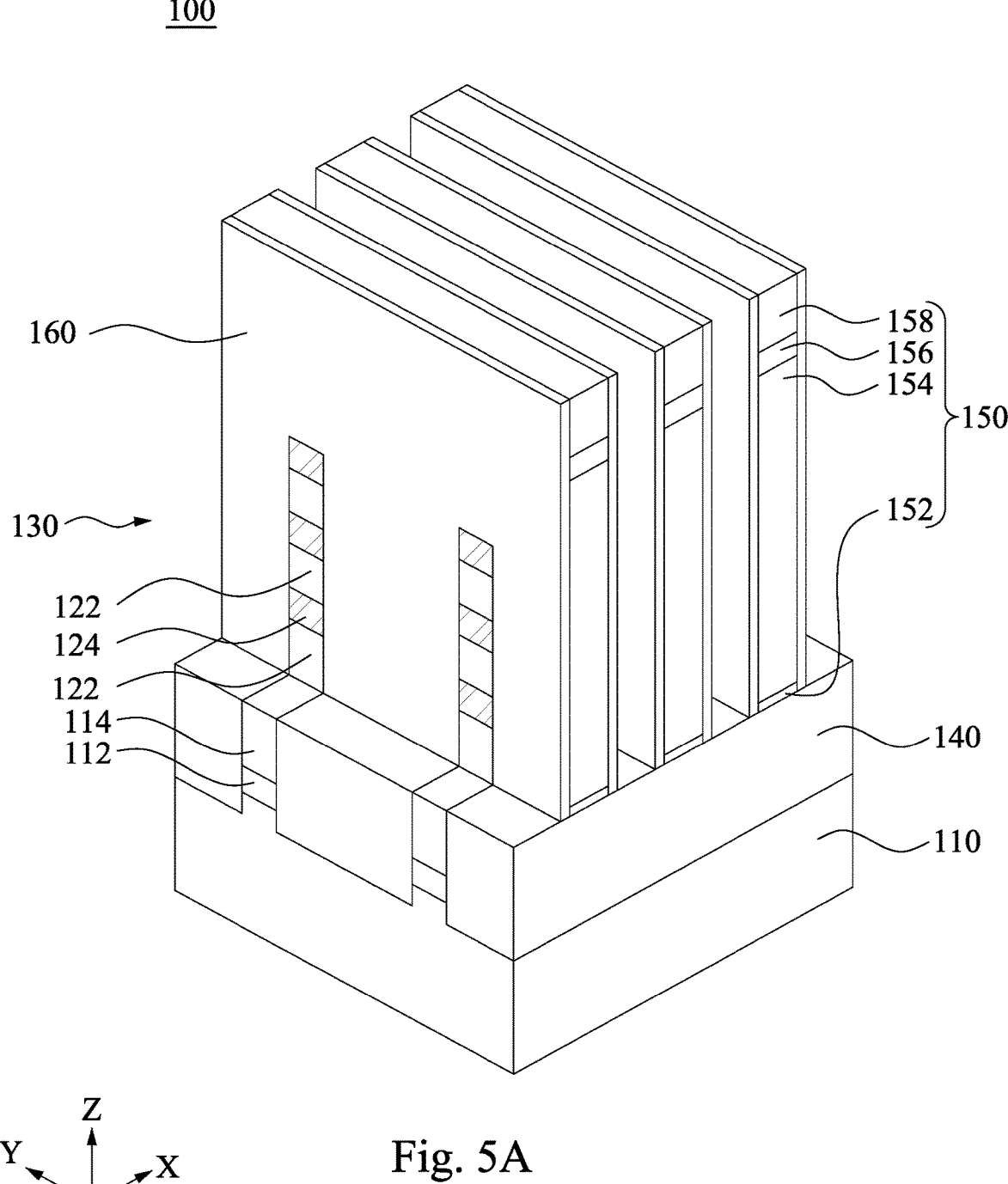
Figure 5B:
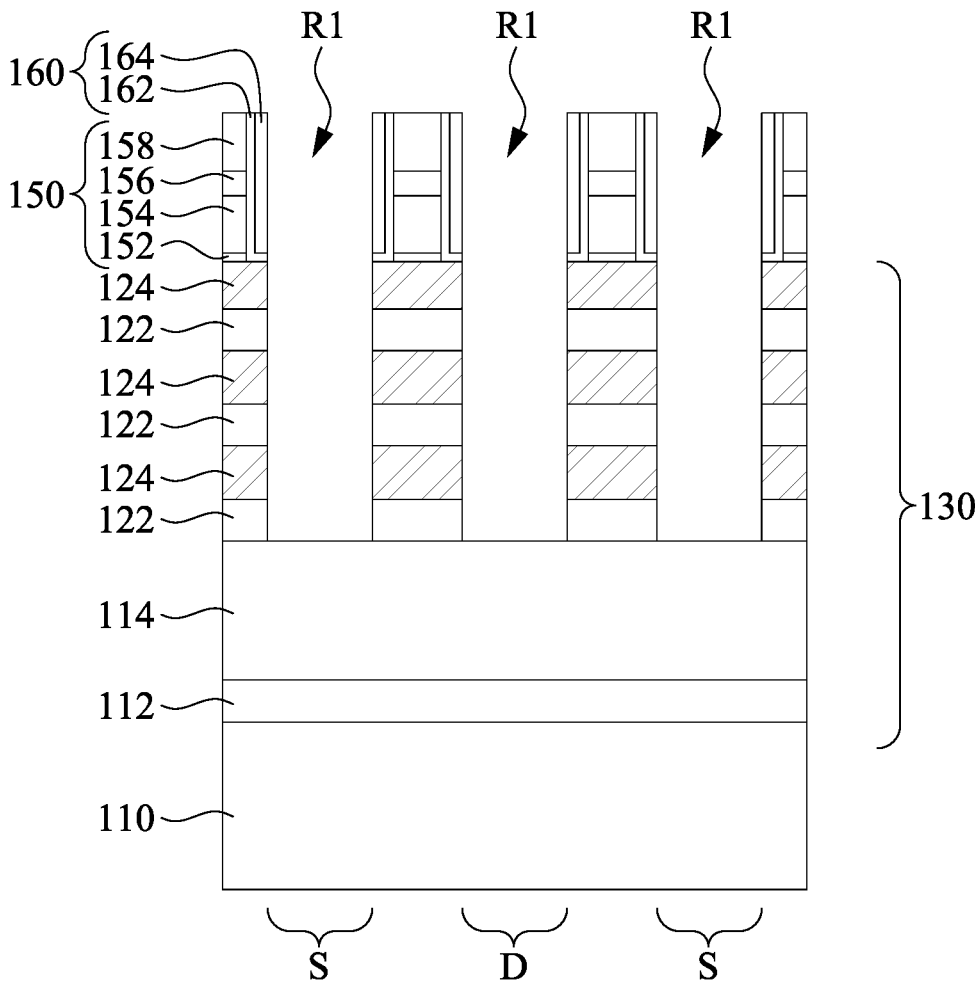

In FIGS. 5A and 5B, exposed portions of the semiconductor fins 130 that extend laterally beyond the gate spacers 160 (e.g., in source/drain regions of the fins 130) are etched by using, for example, an anisotropic etching process that uses the dummy gate structure 150 and the gate spacers 160 as an etch mask, resulting in recesses R1 into the semiconductor fins 130 and between corresponding dummy gate structures 150. After the anisotropic etching, end surfaces of the sacrificial layers 122 and channel layers 124 may be aligned with respective outermost sidewalls of the gate spacers 160, due to the anisotropic etching. In some embodiments, the anisotropic etching may be performed by a dry chemical etch with a plasma source and a reaction gas. The plasma source may be an inductively coupled plasma (ICR)

source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 6A:
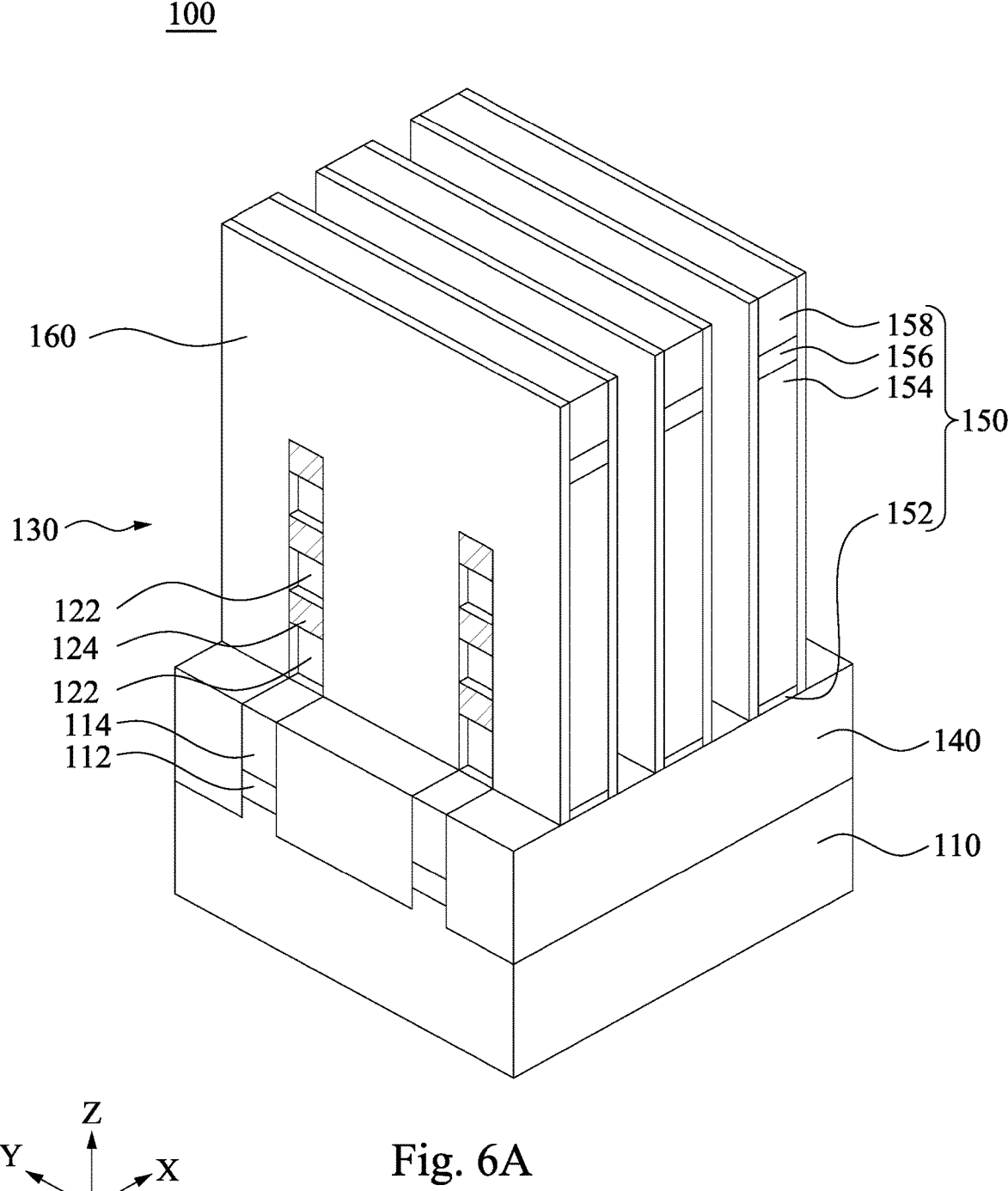
Figure 6B:
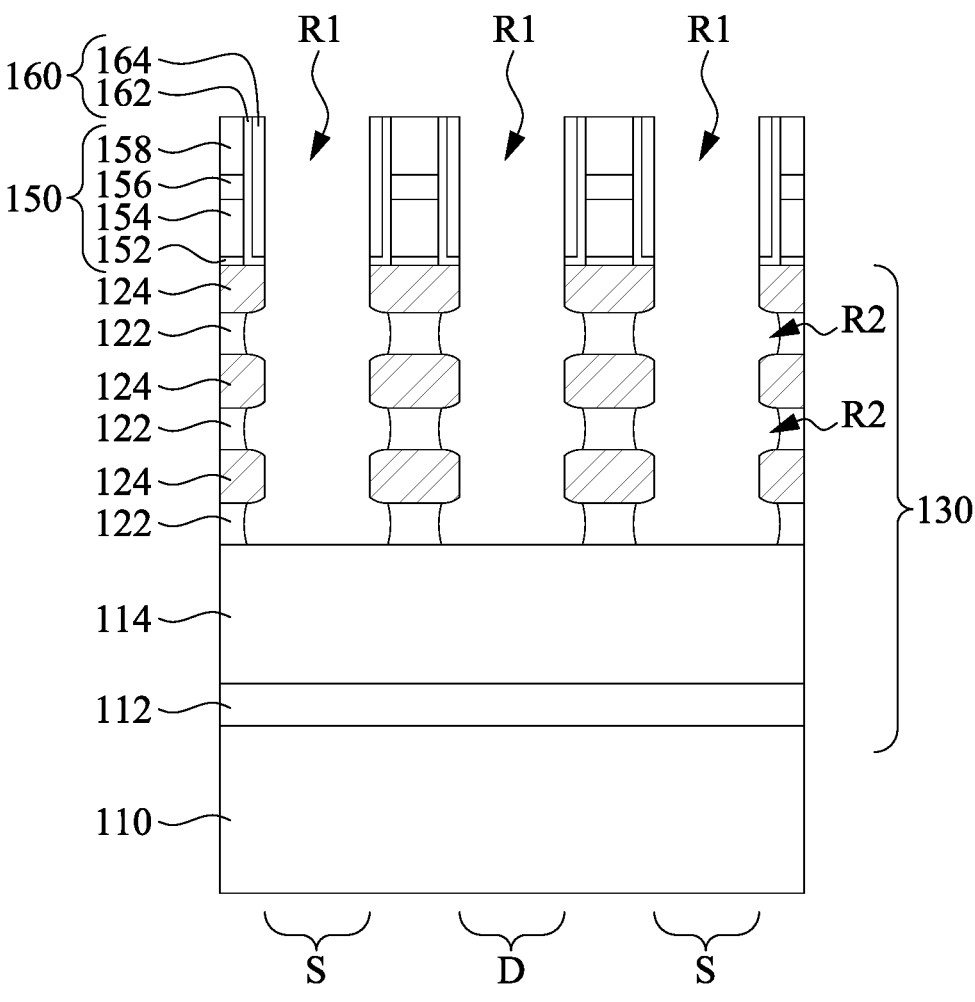

In FIGS. 6A and 6B, the sacrificial layers 122 are laterally or horizontally recessed by using suitable etch techniques, resulting in lateral recesses R2 each vertically between corresponding channel layers 124. This step may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 is not significantly etched by the process of laterally recessing the sacrificial layers 122. As a result, the channel layers 124 laterally extend past opposite end surfaces of the sacrificial layers 122. Because the SiGe insertion layer 112 is buried under the thick Si layer 114 and the STI features 140, the SiGe insertion layer 112 remains intact during the selective SiGe etching process.

Figure 7A:
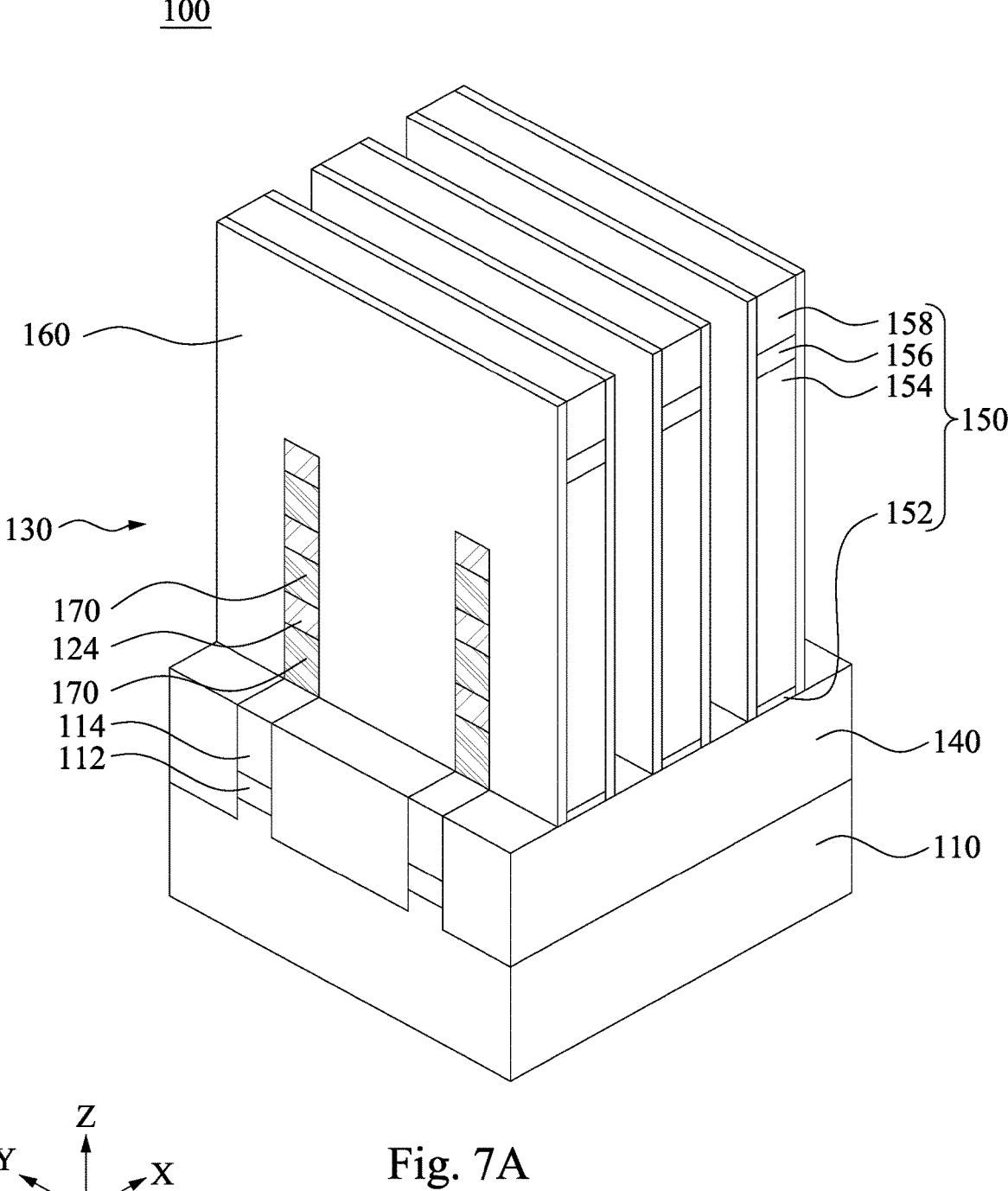
Figure 7B:
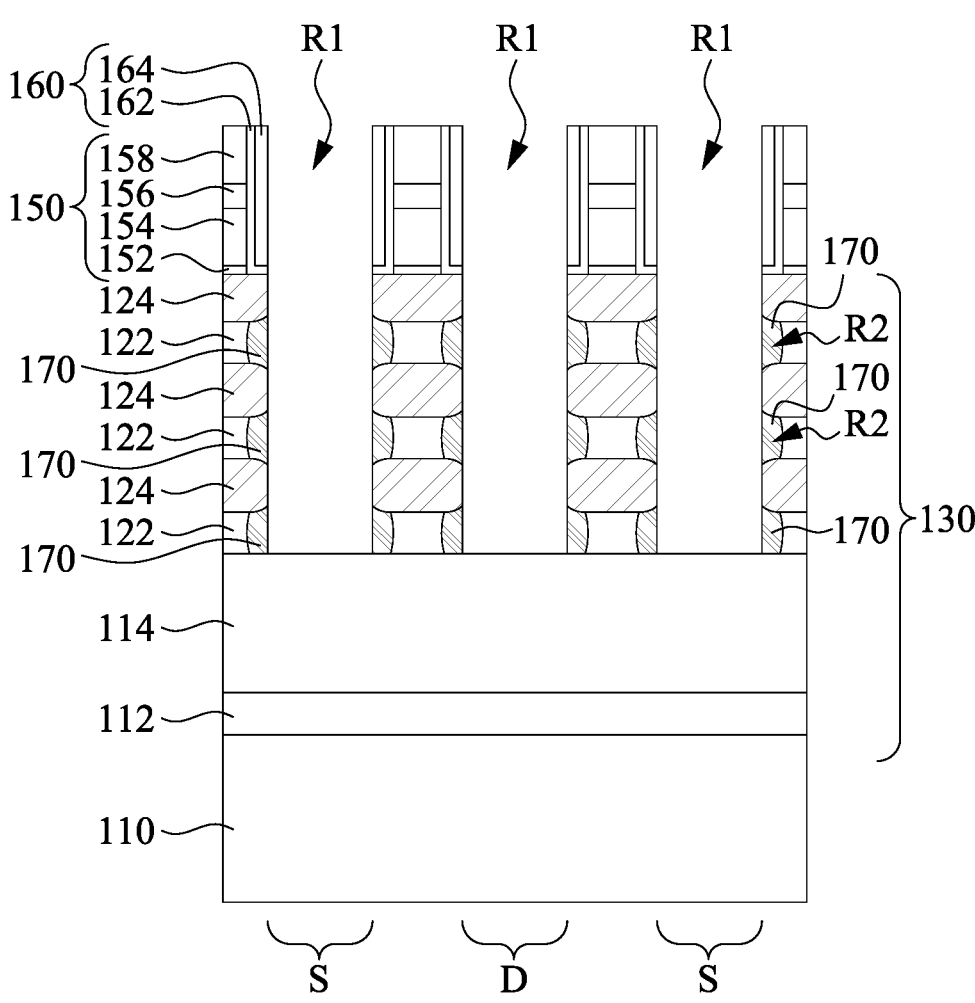

FIGS. 7A and 7B illustrate formation of inner spacers 170 in the recesses R2. In some embodiments, an inner spacer material layer 170 is formed to fill the recesses R2 left by the lateral etching of the sacrificial layers 122 discussed above with reference to FIGS. 6A and 6B. The inner spacer material layer 170 may be a low-K dielectric material, such as $SiO_2$, SiN, SiCN, or SiOCN, and may be formed by a suitable deposition method, such as ALD. After the deposition of the inner spacer material layer 170, an anisotropic etching process may be performed to trim the deposited inner spacer material 170, such that only portions of the deposited inner spacer material 170 that fill the recesses R2 left by the lateral etching of the sacrificial layers 122 are left. After the trimming process, the remaining portions of the deposited inner spacer material are denoted as inner spacers 170, for the sake of simplicity. The inner spacers 170 serve to isolate metal gates from source/drain regions formed in subsequent processing. In the example of FIGS. 7A and 7B, sidewalls of the inner spacers 170 are aligned with sidewalls of the channel layers 124.

Figure 8:
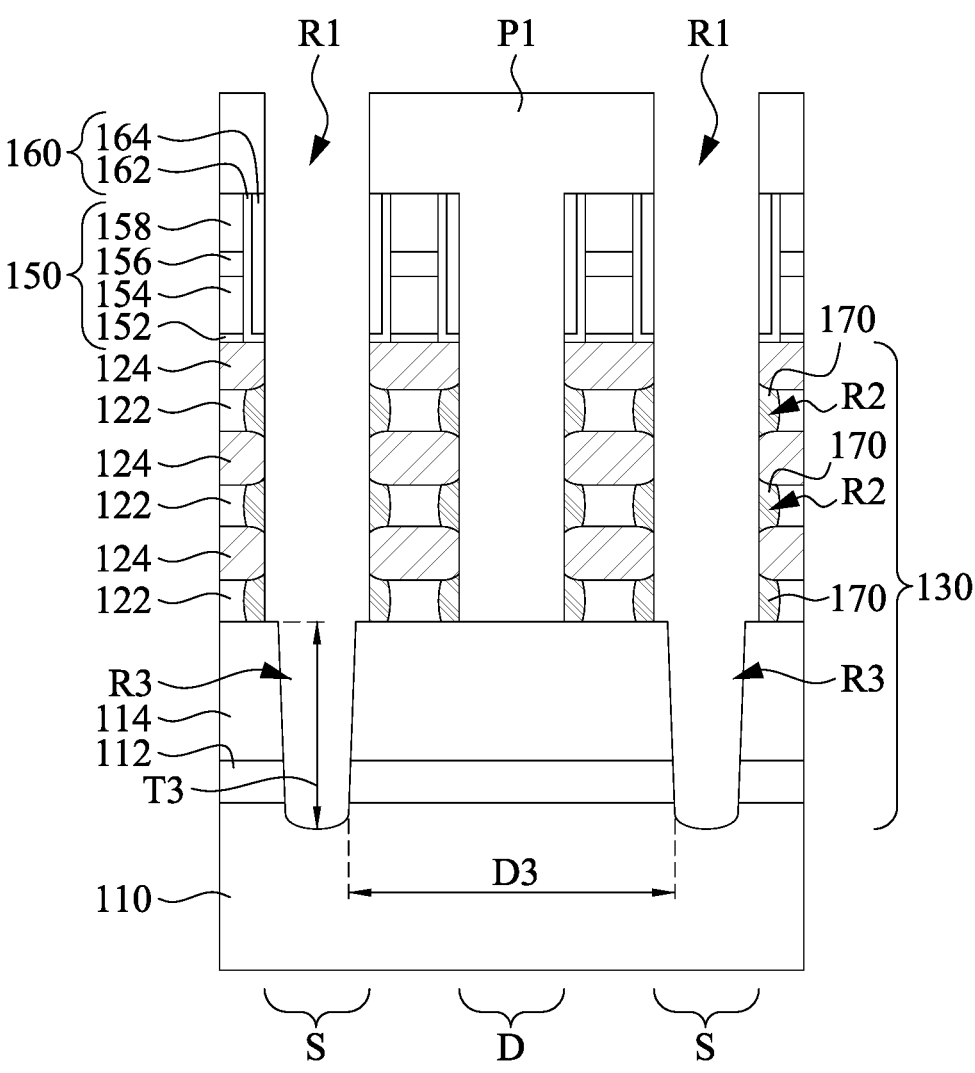

In FIG. 8, a patterned mask P1 is first formed to cover drain regions D of the fins 130 but not cover source regions S of the fins 130, and then the source regions S of the fins 130 are recessed, resulting in source-region recesses R3 in the semiconductor fins 130. In some embodiments, the patterned mask P1 may be a photoresist mask formed by suitable photolithography process. For example, the photolithography process may include spin-on coating a photoresist layer over the structure as illustrated in FIGS. 7A and 7B, performing post-exposure bake processes, and developing the photoresist layer to form the patterned mask P1. In some embodiments, patterning the resist to form the patterned mask element may be performed using an electron beam (e-beam) lithography process or an extreme ultraviolet (EUV) lithography process.

Once the patterned mask P1 is formed, the source-region recesses R3 can be formed in the source regions S using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

The source-region recesses R3 has a depth T3 that is deep enough to penetrate through an entire thickness of the SiGe insertion layer 112. By way of example, the depth T3 of the source-region recesses R3 is in a range from about 20 nm to about 70 nm. However, other ranges of the depth T3 of the source-region recesses R3 are within the scope of various embodiments of the present disclosure, as long as the source-region recesses R3 can extend through the entire thickness of the SiGe insertion layer 112.

In some embodiments as illustrated in FIG. 8, the source-region recesses R3 may have sidewalls laterally offset from outermost sidewalls of the inner spacers 170. This may be because of shadowing effect resulting from directing etchant ions into the deep recesses R1 between dummy gate structures 150. However, in some other embodiments, sidewalls of the source-region recesses R3 may be aligned with outermost sidewalls of the inner spacers 170.

Figure 9:
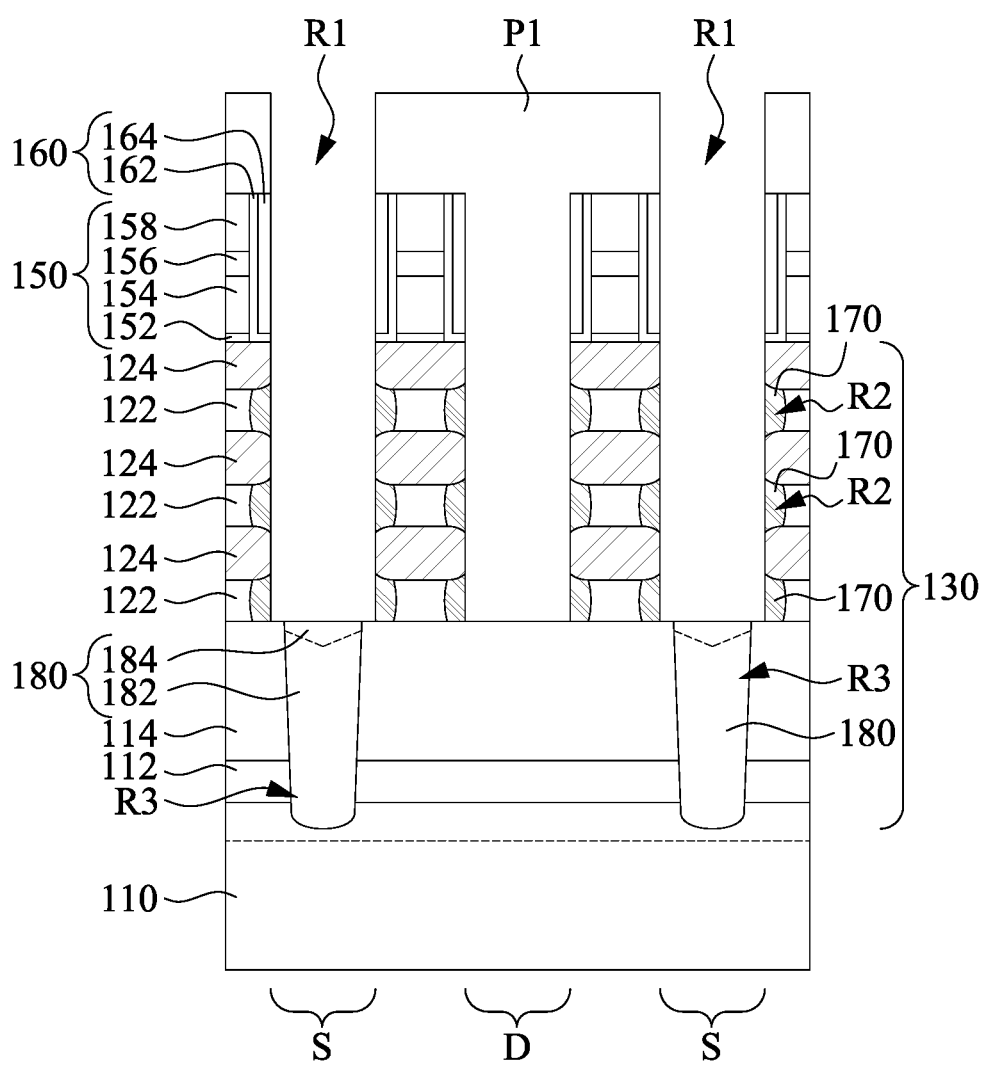

In FIG. 9, with the patterned mask P1 in place, an epitaxial growth process is performed to grow an epitaxial material in the source-region recesses R3 until the epitaxial material builds up sacrificial epitaxial plugs 180 filling the source-region recesses R3. The epitaxial material has a different composition than the substrate 110 and the thick Si layer 114, thus resulting in different etch selectivity between the sacrificial epitaxial plugs 180 and the substrate 110 and the thick Si layer 114. For example, the substrate 110 and the thick Si layer 114 are Si, and the sacrificial epitaxial plugs 180 are SiGe. In such embodiments, the epitaxial plugs 180 and the SiGe insertion layer 112 are formed of a same material (i.e., SiGe), and thus the epitaxial plugs 180 can be interchangeably referred to as SiGe plugs. In some embodiments, the SiGe plugs 180 and the SiGe insertion layer 112 have different germanium atomic percentages (Ge %). For example, in some embodiments, the SiGe insertion layer 112 has a higher germanium atomic percentage than the SiGe plugs 180, so as to increase a lateral etching depth in the SiGe insertion layer 112 in a subsequent SiGe plug removal process, which in turn will increases lateral dimension of subsequently formed backside via.

In some embodiments, the sacrificial epitaxial plugs 180 are SiGe free from p-type dopants (e.g., boron) and n-type dopants (e.g., phosphorous), because the sacrificial epitaxial plugs 180 will be removed in subsequent processing and not serve as source terminals of transistors in a final IC product. In some embodiments, the sacrificial epitaxial plugs 180 each have a first SiGe layer 182 and a second SiGe layer 184 over the first SiGe layer 182. The first and second SiGe layers 182 and 184 are different at least in germanium atomic percentage, which in turn allows for different etch selectivity between the first and second SiGe layers 182 and 184. Therefore, the second SiGe layer 184 can serve as a buffer layer for slowing down the subsequent SiGe plug removal process. In certain embodiments, the first SiGe layer 182 has a higher germanium atomic percentage than the second SiGe layer 184. By way of example and not limitation, the germanium atomic percentage in the first SiGe layer 182 is in a range from about 20% to about 50%, and the germanium atomic percentage in the second SiGe layer 184 is in a range from about 5% to about 20%. In some embodiments, the second SiGe layer 184 has a germanium concentration gradient. For example, Ge % of the second SiGe layer 184 decreases as a distance from the first SiGe layer 182 increases. Once formation of the sacrificial epitaxial plugs 180 is complete, the patterned mask P1 is removed by, for example, ashing.

In order to prevent SiGe from being inadvertently formed on end surfaces of the Si channel layers 124, the SiGe plugs 180 can be grown in a bottom-up fashion, in accordance with some embodiments of the present disclosure. By way of example and not limitation, the SiGe plugs 180 can be grown by an epitaxial deposition/partial etch process, which repeats the epitaxial deposition/partial etch process at least once. Such repeated deposition/partial etch process is also called a cyclic deposition-etch (CDE) process. In some embodiments, these SiGe plugs 180 are grown by selective epitaxial growth (SEG), where an etching gas is added to promote the selective growth of silicon germanium from the bottom surface of the source-region recesses R3 that has a first crystal plane, but not from the vertical end surfaces of the channel layers 124 that have a second crystal plane different from the first crystal plane. For example, the SiGe plugs 180 are epitaxially grown using reaction gases such as HCl as an etching gas, $GeH_4$ as a Ge precursor gas, DCS and/or $SiH_4$ as a Si precursor gas, $H_2$ and/or $N_2$ as a carrier gas. In some embodiments, the etching gas may be other chlorine-containing gases or bromine-containing gases such as $Cl_2$, $BCl_3$, $BiCl_3$, $BiBr_3$ or the like.

SiGe deposition conditions are controlled (e.g., by tuning flow rate ratio among Ge precursor gas, Si precursor gas and carrier gas) in such a way that SiGe growth rate on the bottom surfaces of the source-region recesses R3 is faster than SiGe growth rate on the vertical end surfaces of the channel layers 124, because the bottom surfaces of the source-region recesses R3 and the vertical end surfaces of the channel layers 124 have different crystal orientation planes. Accordingly, the SiGe deposition step incorporating the etching step promotes bottom-up SiGe growth. For example, SiGe is grown from the bottom surface of the source-region recesses R3 at a faster rate than that from the end surfaces of the channel layers 124. The etching gas etches SiGe grown from the end surfaces of the channel layers 124 as well as SiGe grown from the bottom surface of the source-region recesses R3 at comparable etch rates. However, since the SiGe growth rate from the bottom surfaces of the source-region recesses R3 is faster than from the end surfaces of the channel layers 124, the net effect is that SiGe will substantially grow from the bottom surfaces of source-region recesses R3 in the bottom-up fashion. By way of example and not limitation, in each deposition-etch cycle of the CDE process, the etching step stops once the end surfaces of the channel layers 124 are exposed, and the SiGe grown from the bottom surfaces of the source-region recesses R3 remains in the source-region recesses R3 because it is thicker than the SiGe grown from the end surfaces of the channel layers 124. In this way, the bottom-up growth can be realized. The CDE process as discussed above is merely one example to explain how to form SiGe plugs 180 in source-region recesses R3 but absent from end surfaces of Si channel layers 124, and other suitable techniques may also be used to form the SiGe plugs 180.

To achieve different germanium atomic percentages in the first and second SiGe layers 182 and 184, a ratio of a flow rate of the Ge precursor gas (e.g., $GeH_4$) to a flow rate of the Si precursor gas (e.g., $SiH_4$) is varied for their respective growth processes. For example, a Ge-to-Si precursor flow rate ratio during the epitaxial growth of the first SiGe layer 182 is greater than that of the second SiGe layer 184. In this way, the germanium atomic percentage of the first SiGe layer 182 is greater than that of the second SiGe layer 184.

Figure 10:
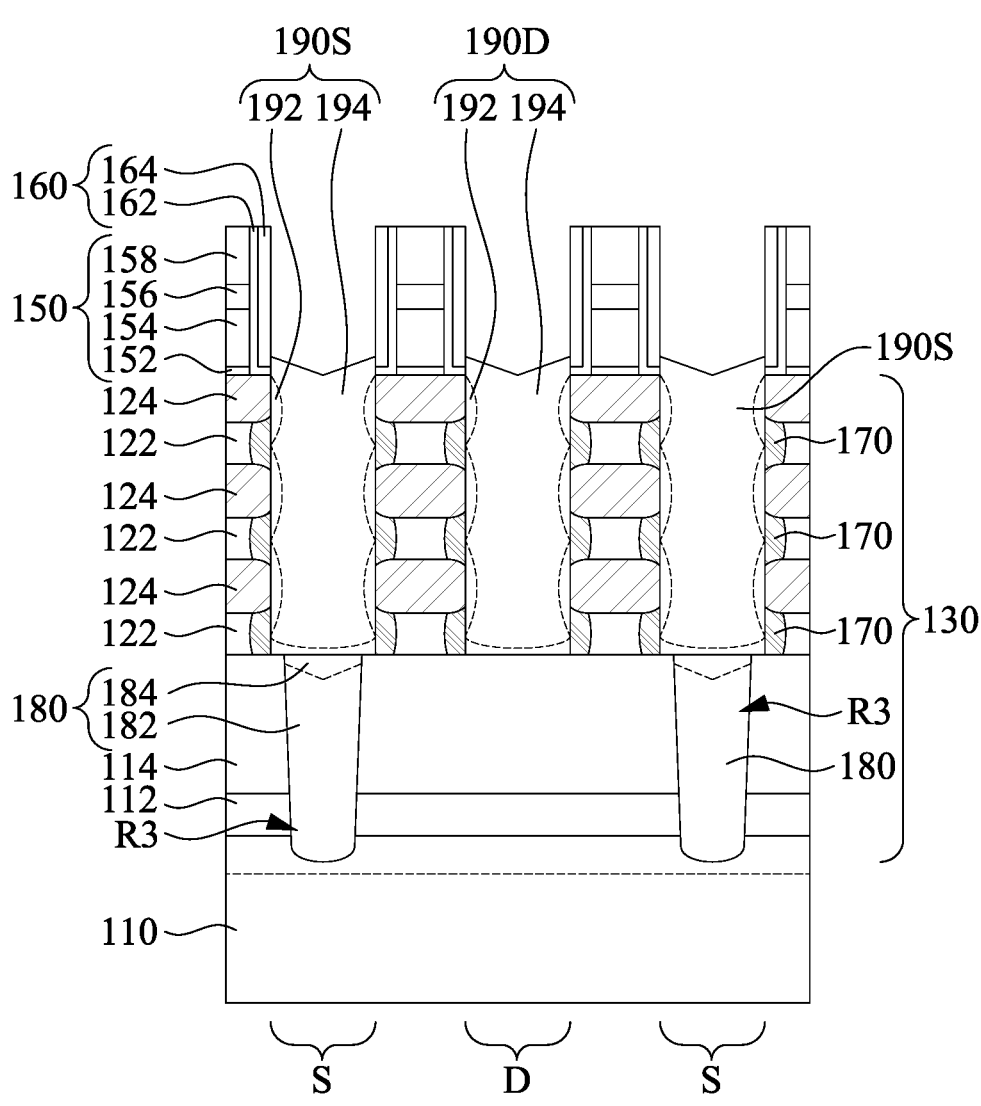

In FIG. 10, source epitaxial structures 190S are formed over the respective sacrificial epitaxial plugs 180, and drain epitaxial structures 190D are formed over the drain regions D of the semiconductor fins 130. The source/drain epitaxial structures 190S/190D may be formed by performing an epitaxial growth process that provides an epitaxial material on the sacrificial epitaxial plugs 180 and the fins 130. During the epitaxial growth process, the dummy gate structures 150 and gate sidewall spacers 160 limit the source/drain epitaxial structures 190S/190D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 130, the sacrificial epitaxial plugs 180 and the channel layers 124.

In some embodiments, the source/drain epitaxial structures 190S/190D may include Ge, Si, GaAs, AlGaAs, SiGe, GaAsP, SiP, or other suitable material. The source/drain epitaxial structures 190S/190D may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 190S/190D are not in-situ doped, an implantation process (i.e., a junction implant process) is performed to dope the source/drain epitaxial structures 190S/190D. In some exemplary embodiments, the source/drain epitaxial structures 190S/190D in an NFET device include SiP, while those in a PFET device include GeSnB and/or SiGeSnB.

In some embodiments, the source/drain epitaxial structures 190S/190D each include a first epitaxial layer 192 and a second epitaxial layer 194 over the first epitaxial layer 192. The first and second epitaxial layers 192 and 194 may be different at least in germanium atomic percentage (Ge %) or phosphorus concentration (P %). In the depicted embodiment, the first epitaxial layer 192 may be not only grown from top surfaces of the sacrificial epitaxial plugs 180 and the fins 130, but also grown from end surfaces of the channel layers 124. This is because formation of the source/drain epitaxial structures 190S/190D does not require the bottom-up approach as discussed previously with respect to sacrificial epitaxial plugs 180.

In some where the source/drain epitaxial structures 190S/190D include GeSnB and/or SiGeSnB for forming PFETs, the first and second epitaxial layers 192 and 194 are different at least in germanium atomic percentage (Ge %). In certain embodiments, the first SiGe layer 192 has a lower germanium atomic percentage than the second SiGe layer 194. Low germanium atomic percentage in the first SiGe layer 192 helps in reducing Schottky barrier with the un-doped Si in the fins 130. High germanium atomic percentage in the second SiGe layer 194 helps in reducing source/drain contact resistance. By way of example and not limitation, the germanium atomic percentage in the first SiGe layer 192 is in a range from about 5% to about 20%, and the germanium atomic percentage in the second SiGe layer 194 is in a range from about 30% to about 50%. In some embodiments, the second SiGe layer 194 may have a gradient germanium atomic percentage. For example, the germanium atomic percentage in the second SiGe layer 194 increases as a distance from the first SiGe layer 192 increases.

In some embodiments where the source/drain epitaxial structures 190S/190D include SiP for forming NFETs, the first and second SiP layers 192 and 194 are different at least in phosphorous concentration (P %). In certain embodiments, the first SiP layer 192 has a lower phosphorous concentration than the second SiP layer 194. Low phosphorous concentration in the first SiP layer 192 helps in reducing Schottky barrier with the un-doped Si in the fins 130. High phosphorous concentration in the second SiP layer 194 helps in reducing source/drain contact resistance. By way of example and not limitation, the phosphorous concentration in the first SiP layer 192 is in a range from about 10% to about 30%, and the phosphorous concentration in the second SiP layer 194 is in a range from about 20% to about 60%. In some embodiments, the second SiP layer 194 may have a gradient phosphorous concentration. For example, the phosphorous concentration in the second SiP layer 194 increases as a distance from the first SiP layer 192 increases.

Once the source/drain epitaxial structures 190S/190D are formed, an annealing process can be performed to activate the p-type dopants or n-type dopants in the source/drain epitaxial structures 190S/190D. The annealing process may be, for example, a rapid thermal anneal (RTA), a laser anneal, a millisecond thermal annealing (MSA) process or the like.

Figure 11:
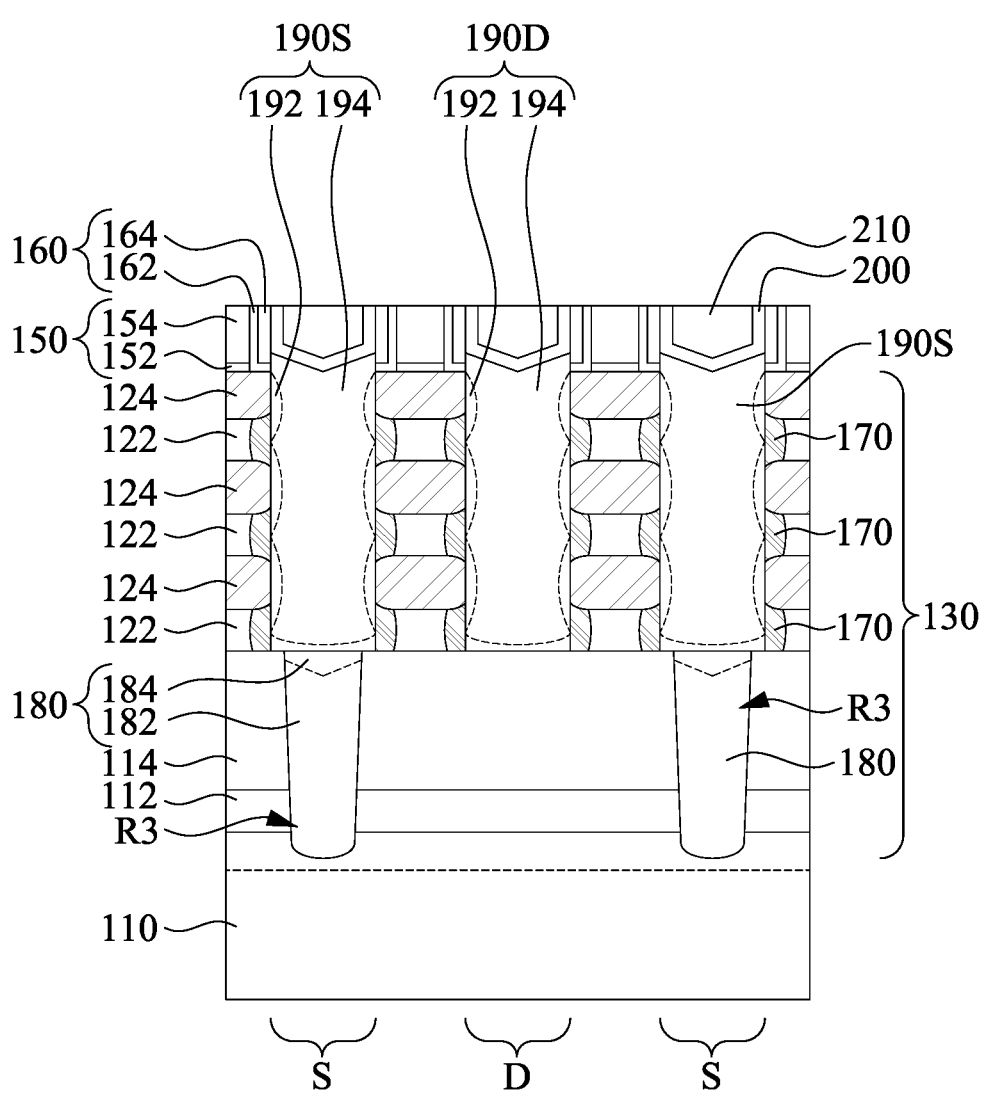
Figure 12:
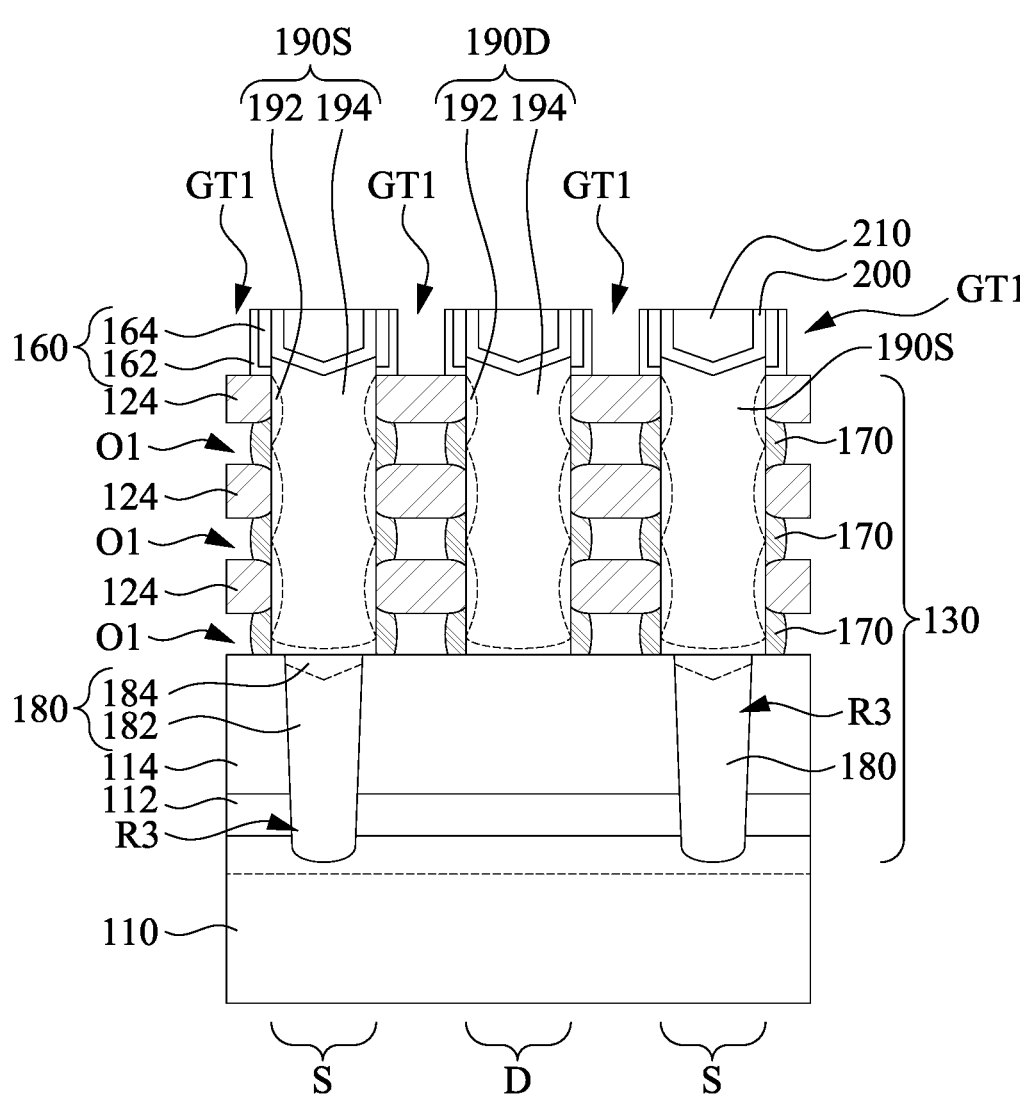

In FIG. 11, a front-side ILD layer 210 is formed on the substrate 110. The ILD layer 210 is referred to a "front-side" ILD layer in this context because it is formed on a front-side of the multi-gate transistors (i.e., a side of the multi-gate transistors that gates protrude from source/drain regions 190S/190D). In some embodiments, a contact etch stop layer (CESL) 200 is also formed prior to forming the ILD layer 210. In some examples, the CESL includes a silicon nitride layer, silicon oxide layer, a silicon oxynitride layer, and/or other suitable materials having a different etch selectivity than the front-side ILD layer 210. The CESL may be formed by plasma-enhanced chemical vapor deposition (PECVD) process and/or other suitable deposition or oxidation processes. In some embodiments, the front-side ILD layer 210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 200. The front-side ILD layer 210 may be deposited by a PECVD process or other suitable deposition technique. In some embodiments, after formation of the front-side ILD layer 210, the integrated circuit structure 100 may be subject to a high thermal budget process to anneal the front-side ILD layer 210.

In some examples, after depositing the front-side ILD layer, a planarization process may be performed to remove excessive materials of the front-side ILD layer. For example, a planarization process includes a chemical mechanical planarization (CMP) process which removes portions of the front-side ILD layer 210 (and CESL layer, if present) overlying the dummy gate structures 150 and planarizes a top surface of the integrated circuit structure 100. In some embodiments, the CMP process also removes hard mask layers 156, 158 (as shown in FIG. 10) and exposes the dummy gate electrode layer 154.

Next, the dummy gate structures 150 are removed first, and then the sacrificial layers 122 are removed. The resulting structure is illustrated in FIG. 12. In the illustrated embodiments, the dummy gate structures 150 are first removed by using a selective etching process (e.g., selective dry etching, selective wet etching, or a combination thereof) that etches the materials in dummy gate structures 150 at a faster etch rate than it etches other materials (e.g., gate sidewall spacers 160, CESL 200 and/or front-side ILD layer 210), thus resulting in gate trenches GT1 between corresponding gate sidewall spacers 160, with the sacrificial layers 122 exposed in the gate trenches GT1. Subsequently, the sacrificial layers 122 exposed in the gate trenches GT1 are removed by using another selective etching process that etches the sacrificial layers 122 at a faster etch rate than it etches the channel layers 124, thus forming openings O1 between neighboring channel layers 124. In this way, the channel layers 124 become nanosheets suspended over the substrate 110 and between the source/drain epitaxial structures 190S/190D. This step is also called a channel release process. At this interim processing step, the openings O1 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122. In that case, the resultant channel layers 124 can be called nanowires.

In some embodiments, the sacrificial layers 122 are removed by using a selective wet etching process. In some embodiments, the sacrificial layers 122 are SiGe and the channel layers 124 are silicon allowing for the selective removal of the sacrificial layers 122. In some embodiments, the selective wet etching includes an APM etch (e.g., ammonia hydroxide-hydrogen peroxide-water mixture). In some embodiments, the selective removal includes SiGe oxidation followed by a SiGeO$_x$ removal. For example, the oxidation may be provided by O$_3$ clean and then SiGeO$_x$ removed by an etchant such as NH$_4$OH that selectively etches SiGeO$_x$ at a faster etch rate than it etches Si. Moreover, because oxidation rate of Si is much lower (sometimes 30 times lower) than oxidation rate of SiGe, the channel layers 124 may not be significantly etched by the channel release process. It can be noted that both the channel release step and the previous step of laterally recessing sacrificial layers (i.e., step S107) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers. Because the SiGe insertion layer 112 is buried under the thick Si layer 114 and the STI features 140, the SiGe insertion layer 112 remains intact during the channel release process.

Figure 13A:
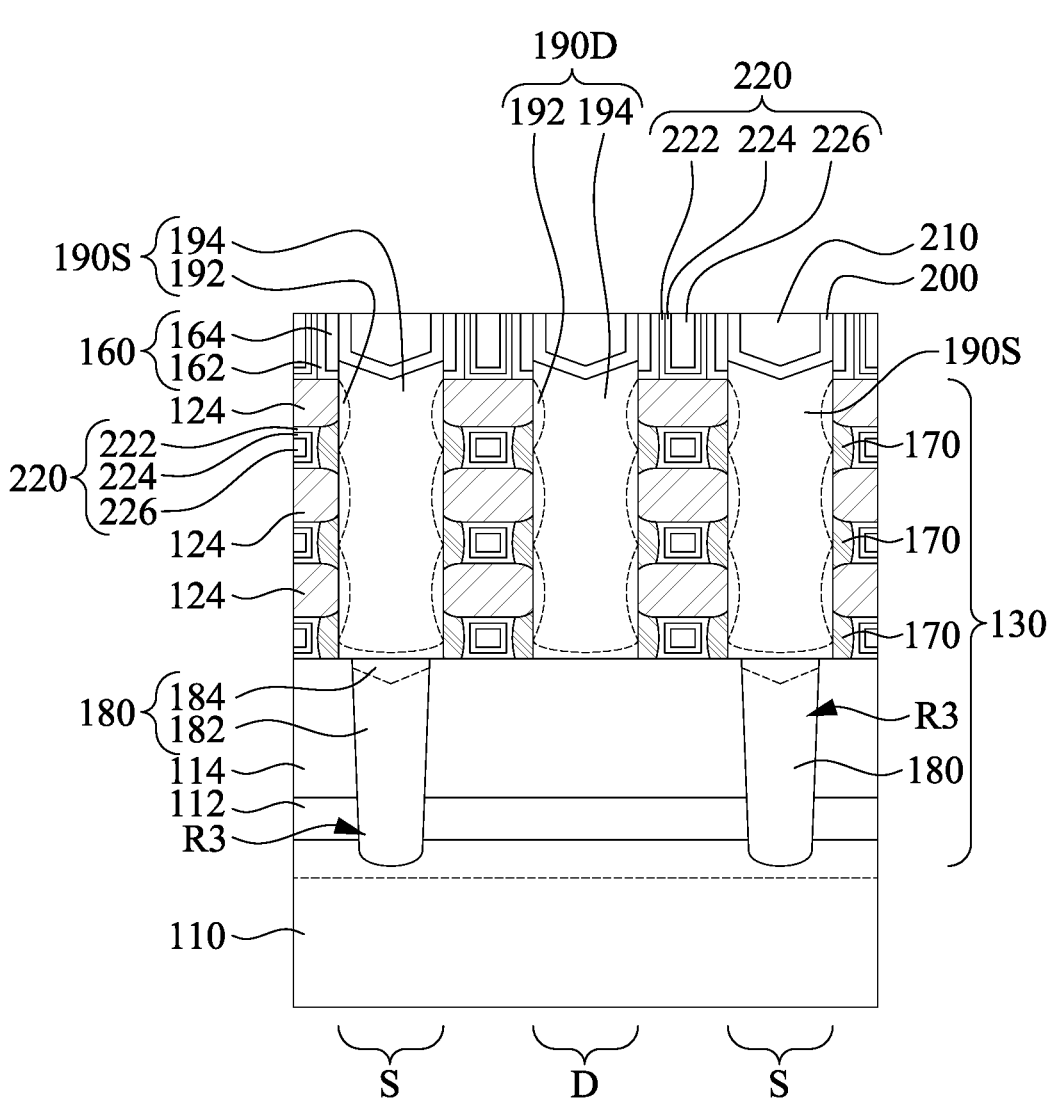
Figure 13B:
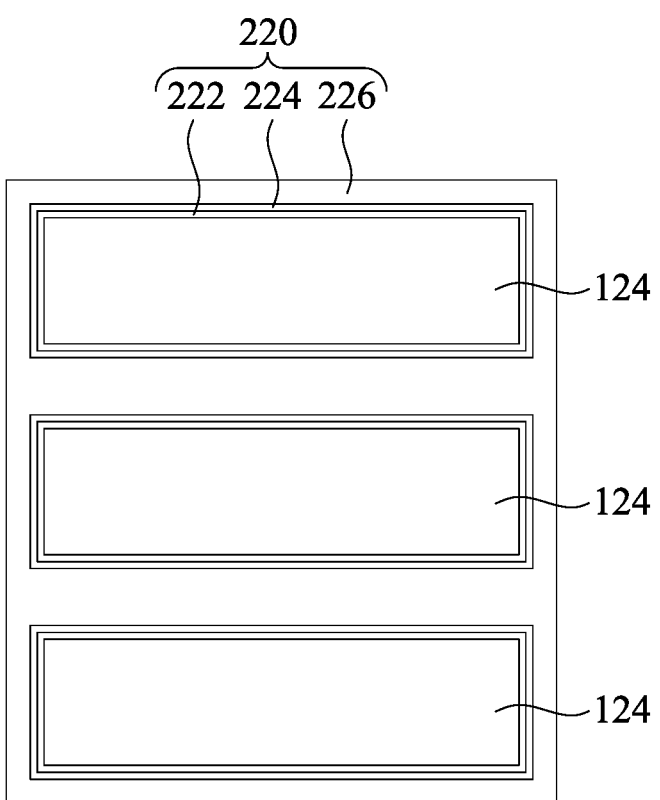
FIG. 13B is a cross-sectional view of some embodiments of the integrated circuit structure at intermediate stages of the IC fabrication method along a second cut (e.g., cut Y-Y in FIG. 4A), which is in the gate region and perpendicular to the lengthwise direction of the channel.

In FIGS. 13A and 13B, where replacement gate structures 220 are respectively formed in the gate trenches GT1 to surround each of the nanosheets 124 suspended in the gate trenches GT1. The gate structure 220 may be the final gate of a GAA FET. The final gate structure may be a high-k/ metal gate stack, however other compositions are possible. In some embodiments, each of the gate structures 220 forms the gate associated with the multi-channels provided by the plurality of nanosheets 124. For example, high-k/metal gate structures 220 are formed within the openings O1 (as illustrated in FIG. 12) provided by the release of nanosheets 124. In various embodiments, the high-k/metal gate structure 220 includes a gate dielectric layer 222 formed around the nanosheets 124, a work function metal layer 224 formed around the gate dielectric layer 222, and a fill metal 226 formed around the work function metal layer 224 and filling a remainder of gate trenches GT1. The gate dielectric layer 222 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 224 and/or fill metal layer 226 used within high-k/metal gate structures 220 may include a metal, metal alloy, or metal silicide. Formation of the high-k/metal gate structures 220 may include depositions to form various gate materials, one or more liner layers, and one or more CMP processes to remove excessive gate materials. As illustrated in a cross-sectional view of FIG. 13B that is taken along a longitudinal axis of a high-k/metal gate structure 220, the high-k/metal gate structure 220 surrounds each of the nanosheets 124, and thus is referred to as a gate of a GAA FET.

In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 224 may include work function metals to provide a suitable work function for the high-k/metal gate structures 220. For an n-type GAA FET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 224 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 14:
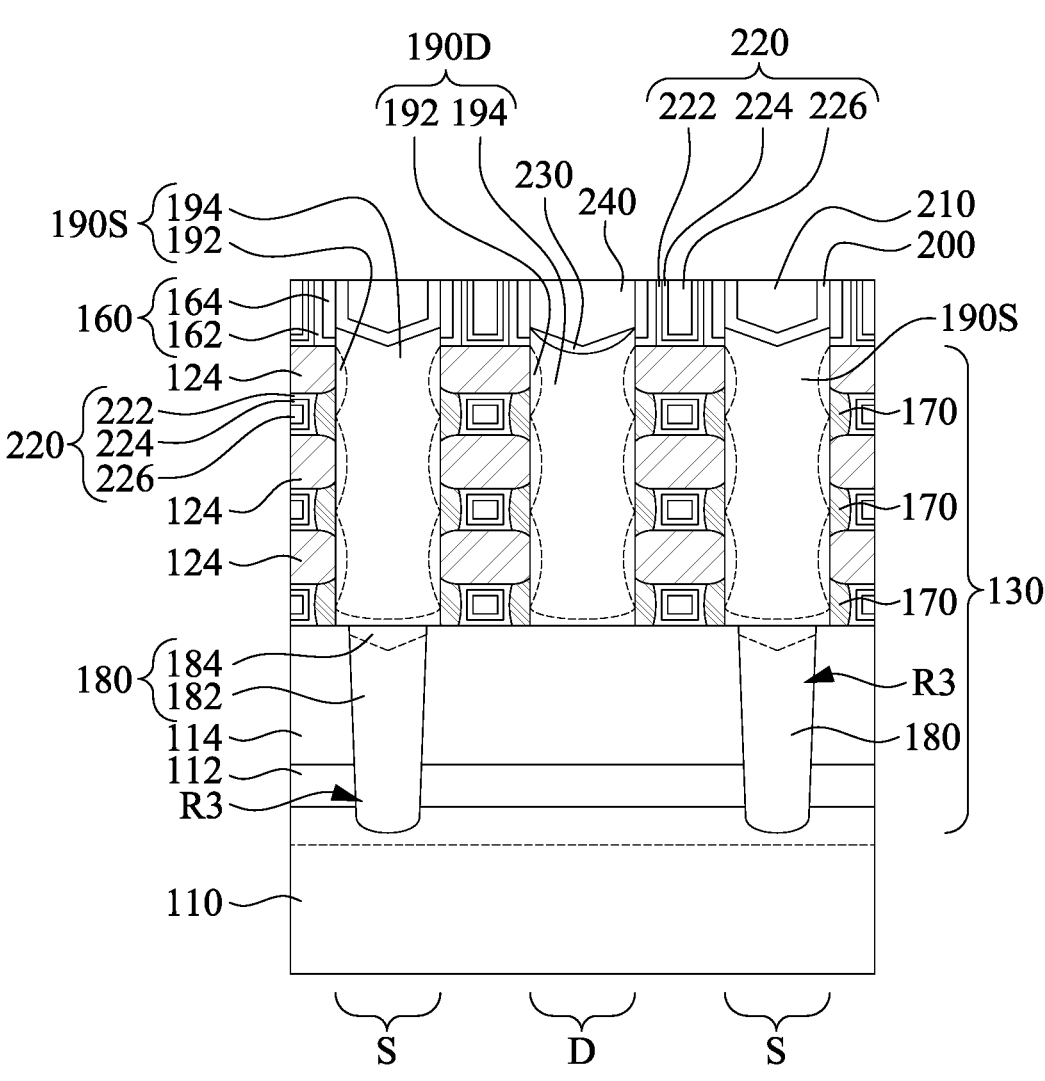

FIG. 14 illustrates formation of a drain contact 240 formed over the drain epitaxial structure 190D. In some embodiments, a drain contact opening is formed through the front-side ILD layer 210 and the CESL 200 to expose the drain epitaxial structure 190D by using suitable photolithography and etching techniques. Subsequently, a drain silicide region 230 is formed on the front side of the drain epitaxial structure 190D by using a silicidation process, followed by forming a drain contact 240 over the drain silicide region 230. Silicidation may be formed by depositing a metal layer (e.g., nickel layer or cobalt layer) over the exposed drain epitaxial structure 190D, annealing the metal layer such that the metal layer reacts with silicon (and germanium if present) in the drain epitaxial structure 190D to form the metal silicide region 230 (e.g., nickel silicide or cobalt silicide), and thereafter removing the non-reacted metal layer. Drain contact 240 may be formed by depositing one or more metal materials (e.g., tungsten, cobalt, copper, the like or combinations thereof) to fill the drain contact hole by using suitable deposition techniques (e.g., CVD, PVD, ALD, the like or combinations thereof), followed by a CMP process to remove excess metal materials outside the drain contact opening.

Figure 15:
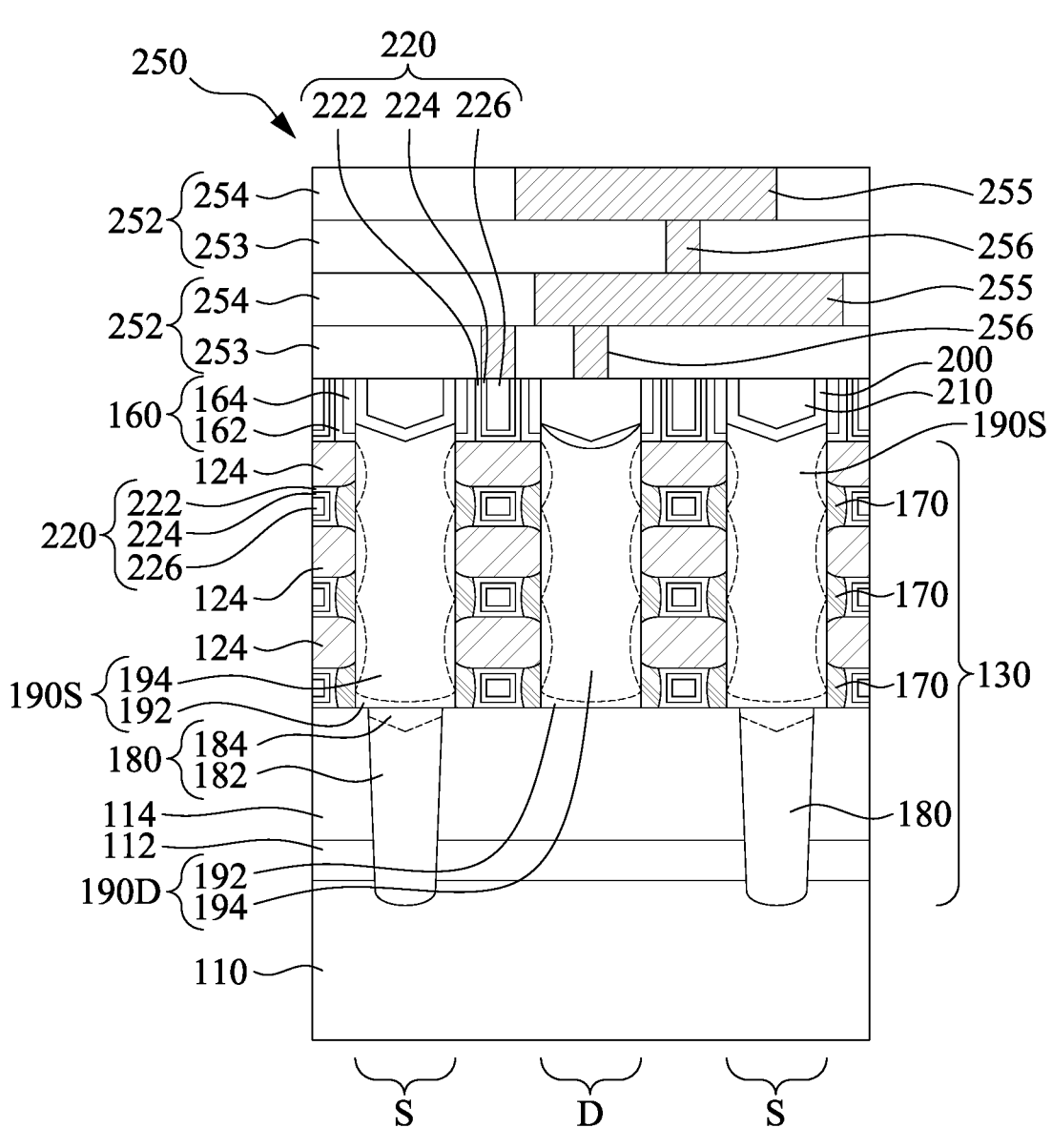

In FIG. 15, a front-side multilayer interconnection (MLI) structure 250 is formed over the substrate 110. The front-side MLI structure 250 may comprises a plurality of front-side metallization layers 252. The number of front-side metallization layers 252 may vary according to design specifications of the integrated circuit structure 100. Only two front-side metallization layers 252 are illustrated in FIG. 15 for the sake of simplicity. The front-side metallization layers 252 each comprise a first front-side inter-metal dielectric (IMD) layer 253 and a second front-side IMD layer 254. The second front-side IMD layers 254 are formed over the corresponding first front-side IMD layers 253. The front-side metallization layers 252 comprise one or more horizontal interconnects, such as front-side metal lines 255, respectively extending horizontally or laterally in the second front-side IMD layers 254 and vertical interconnects, such as front-side conductive vias 256, respectively extending vertically in the first front-side IMD layers 253.

In some embodiments, a front-side conductive via 256 in a bottommost front-side metallization layer 252 is in contact with the gate structure 220 to make electrical connection to the gate structure 220, and a front-side conductive via 256 in the bottommost front-side metallization layer 252 is in contact with the drain contact 240 to make electrical connection to the drain epitaxial structure 190D.

The front-side metal lines 255 and front-side metal vias 256 can be formed using, for example, a single damascene process, a dual damascene process, the like, or combinations thereof. In some embodiments, the front-side IMD layers 253-254 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 255 and 256 may comprise metal materials such as copper, aluminum, tungsten, combinations thereof, or the like. In some embodiments, the front-side metal lines and vias 255 and 256 may further comprise one or more barrier/adhesion layers (not shown) to protect the respective front-side IMD layers 253-254 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 16:
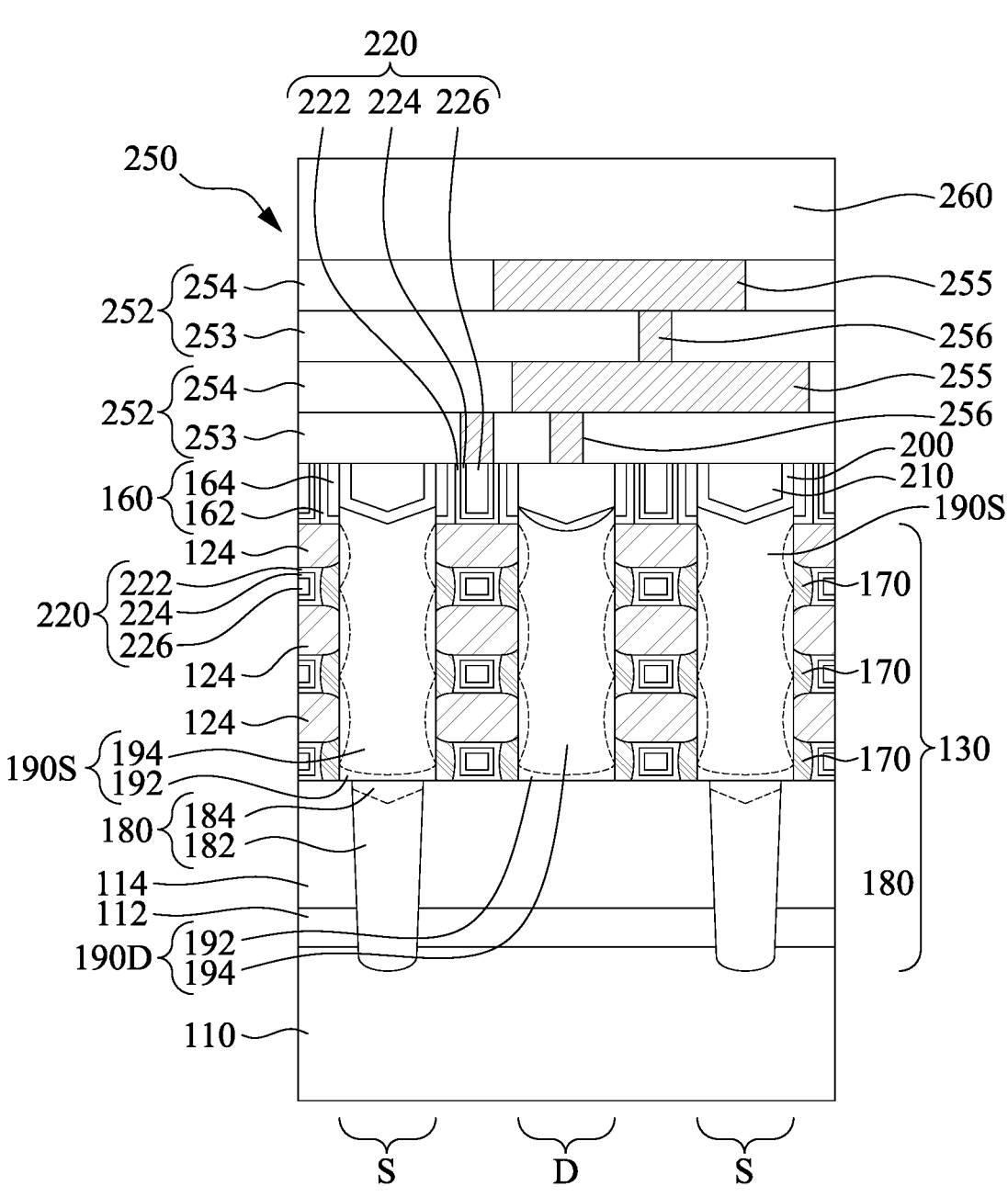
Figure 17:
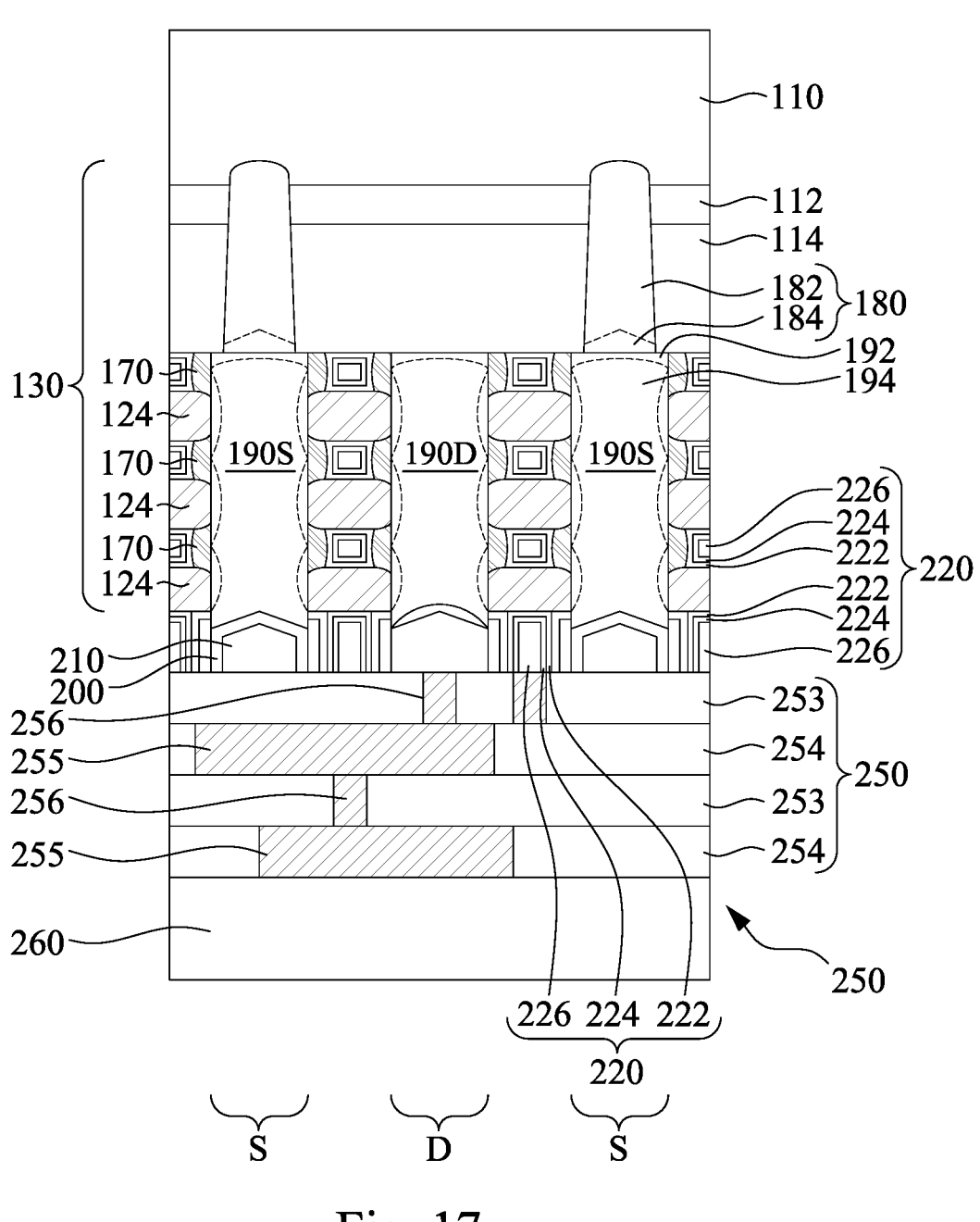

In FIG. 16, a carrier substrate 260 is bonded to the front-side MLI structure 250 in accordance with some embodiments of the present disclosure. The carrier substrate 260 may be silicon, doped or undoped, or may include other semiconductor materials, such as germanium; a compound semiconductor; or combinations thereof. The carrier substrate 260 may provide a structural support during subsequent processing on backside of the integrated circuit structure 100 and may remain in the final product in some embodiments. In some other embodiments, the carrier substrate 260 may be removed after the subsequent processing on backside of integrated circuit structure 100 is complete. In some embodiments, the carrier substrate 260 is bonded to a topmost dielectric layer of the MLI structure 250 by, for example, fusion bonding. Afterwards, the integrated circuit structure 100 is flipped upside down, such that a backside surface of the substrate 110 faces upwards, as illustrated in FIG. 17.

Figure 18:
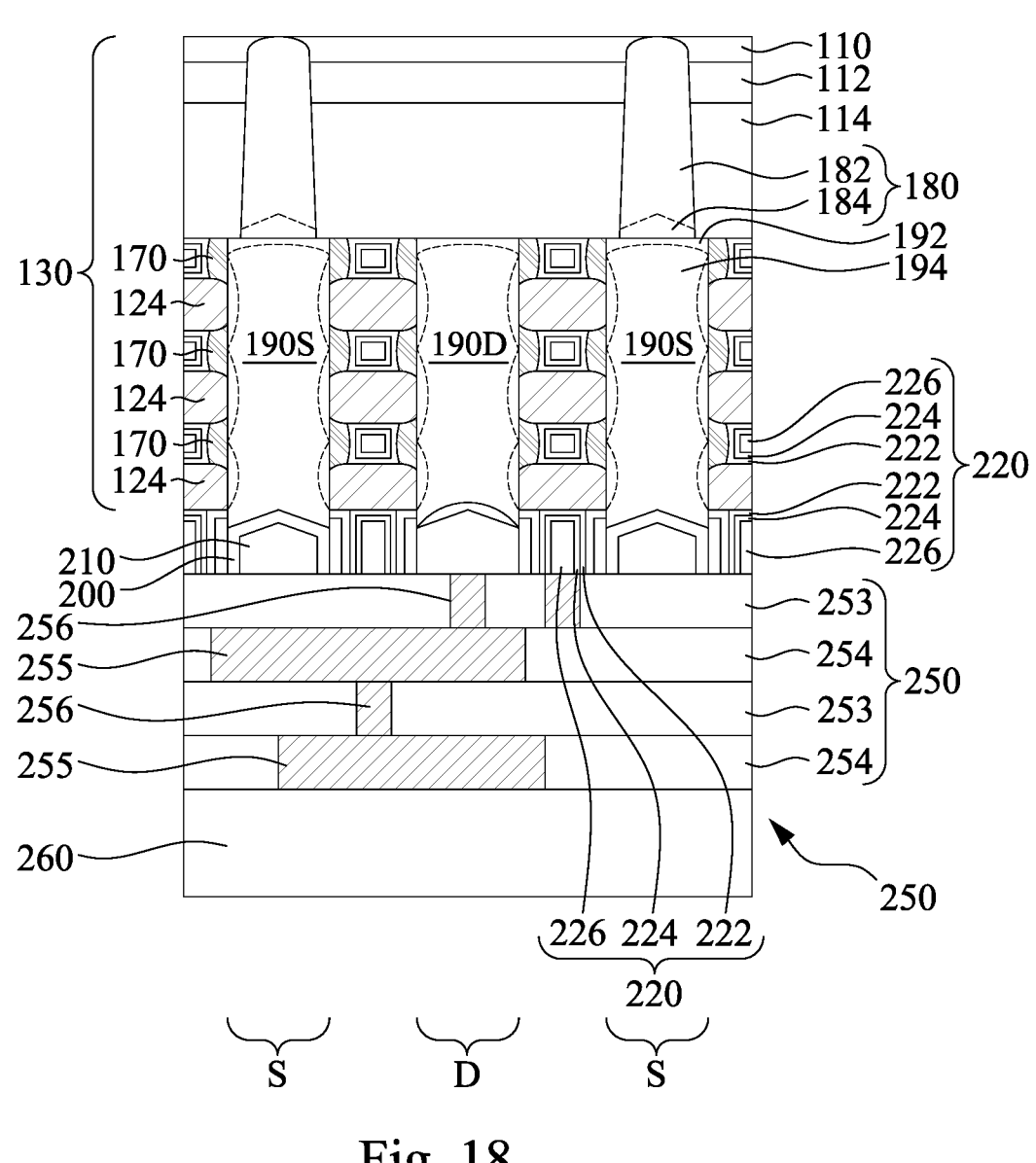

In FIG. 18, the substrate 110 is thinned down to expose the sacrificial epitaxial plugs 180. In some embodiments, thinning is accomplished by a CMP process, a grinding process, or the like.

Figure 19:
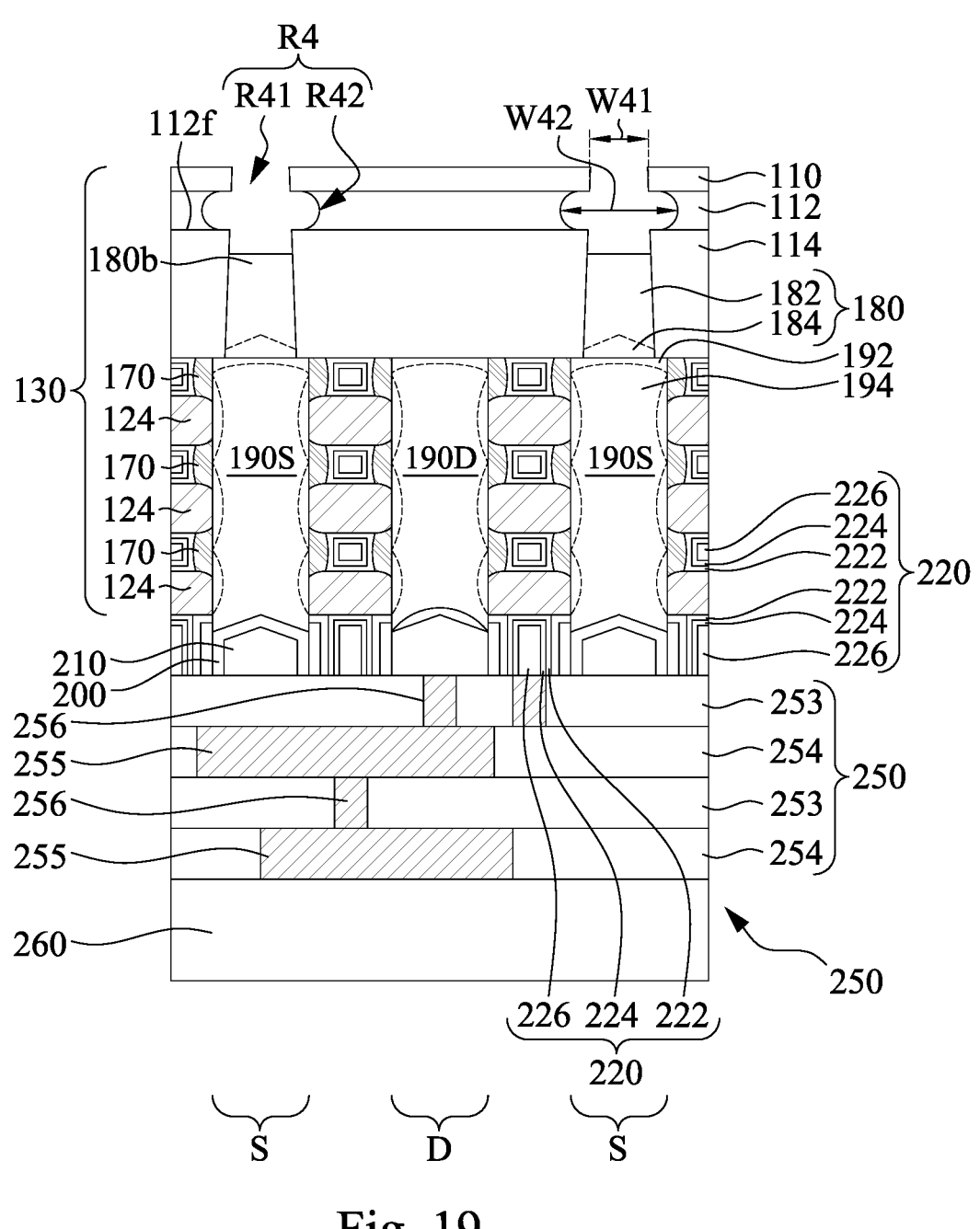

In FIG. 19, a SiGe selective etching process is performed on backside surfaces of the exposed SiGe plugs 180 and backside surface of the Si substrate 110. Because the SiGe selective etching process etches SiGe at a faster etch rate than it etches Si, the SiGe selective etching process forms backside recesses R4 in SiGe plugs 180 and also in the SiGe insertion layer 112. The backside recess R4 is larger in the SiGe insertion layer 112 than in the Si substrate 110 because of the etch rate difference. In particular, the backside recesses R4 has a trapezoidal profile R41 and laterally protruding profiles R42 laterally extending from opposite legs of the trapezoidal profile R41 into the SiGe insertion layer 112. In some embodiments, the trapezoidal profile R41 has a width W41 at the SiGe insertion layer 112, and the width W41 is in a range from about 15 nm to about 30 nm, and the backside recess R4 has a maximal width W42 at the SiGe insertion layer 112, and the maximal width W42 is in a range from about 17 nm to about 40 nm, which means each laterally protruding profile R42 has a width in a range from about 1 nm to about 5 nm. In some embodiments, the maximal width W42 of the backside recess R4 is greater than a width of the source epitaxial structure 190S, which in turn allows for an increased contact area between the source epitaxial structure 190S and a subsequently formed backside via.

Given that the backside recesses R4 have an increased lateral dimension (i.e., W42) because of the SiGe insertion layer 112, backside vias formed in subsequent processing can have an increased lateral dimension. In some embodiments, the SiGe selective etching process is a dry etching. For example, the SiGe selective etching is a plasma etching using a plasma etchant generated from a fluorine-based gas (e.g., $CF_4$, $NF_3$, or the like). After the SiGe selective etching process is completed, backside surfaces 180b of the SiGe plugs 180 may be lower than a front-side surface 112f of the SiGe insertion layer 112, so as to allows for etching duration long enough to form laterally protruding profiles R42 with sufficient large widths.

Figure 20:
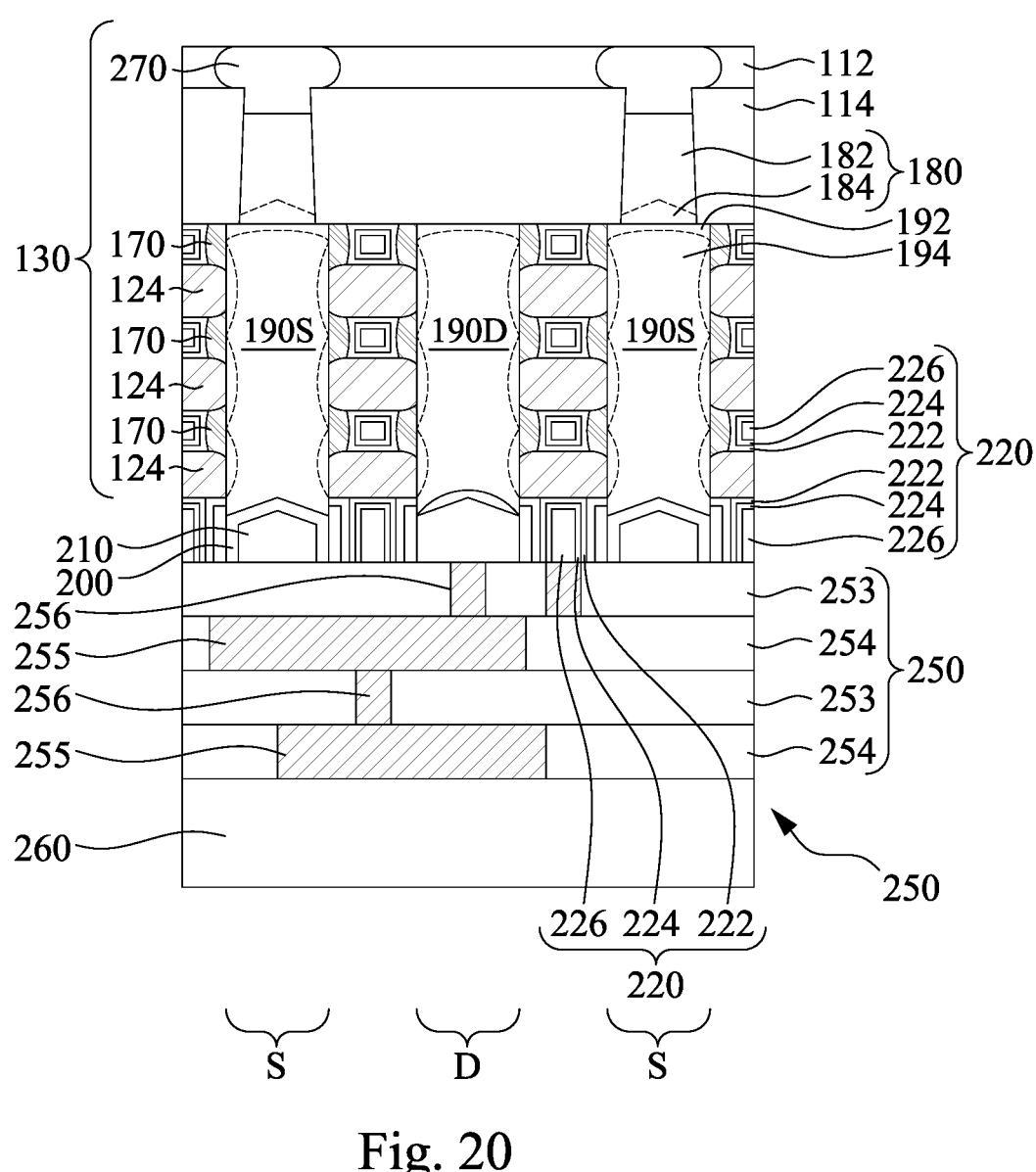

In FIG. 20, hard masks 270 are formed in the respective backside recesses R4. In some embodiments, formation of the hard masks 270 includes, for example, depositing a dielectric material overfilling the backside recesses R4, followed by performing a CMP process on the dielectric material at least until the backside surface of the SiGe insertion layer 112 gets exposed. Remaining portions of the dielectric material in the backside recesses R4 serve as the hard masks 270. The CMP process may completely remove the substrate 110 in some embodiments. In some embodiments, the hard masks 270 are formed of silicon nitride ($SiN_x$) or other suitable dielectric materials.

Figure 21:
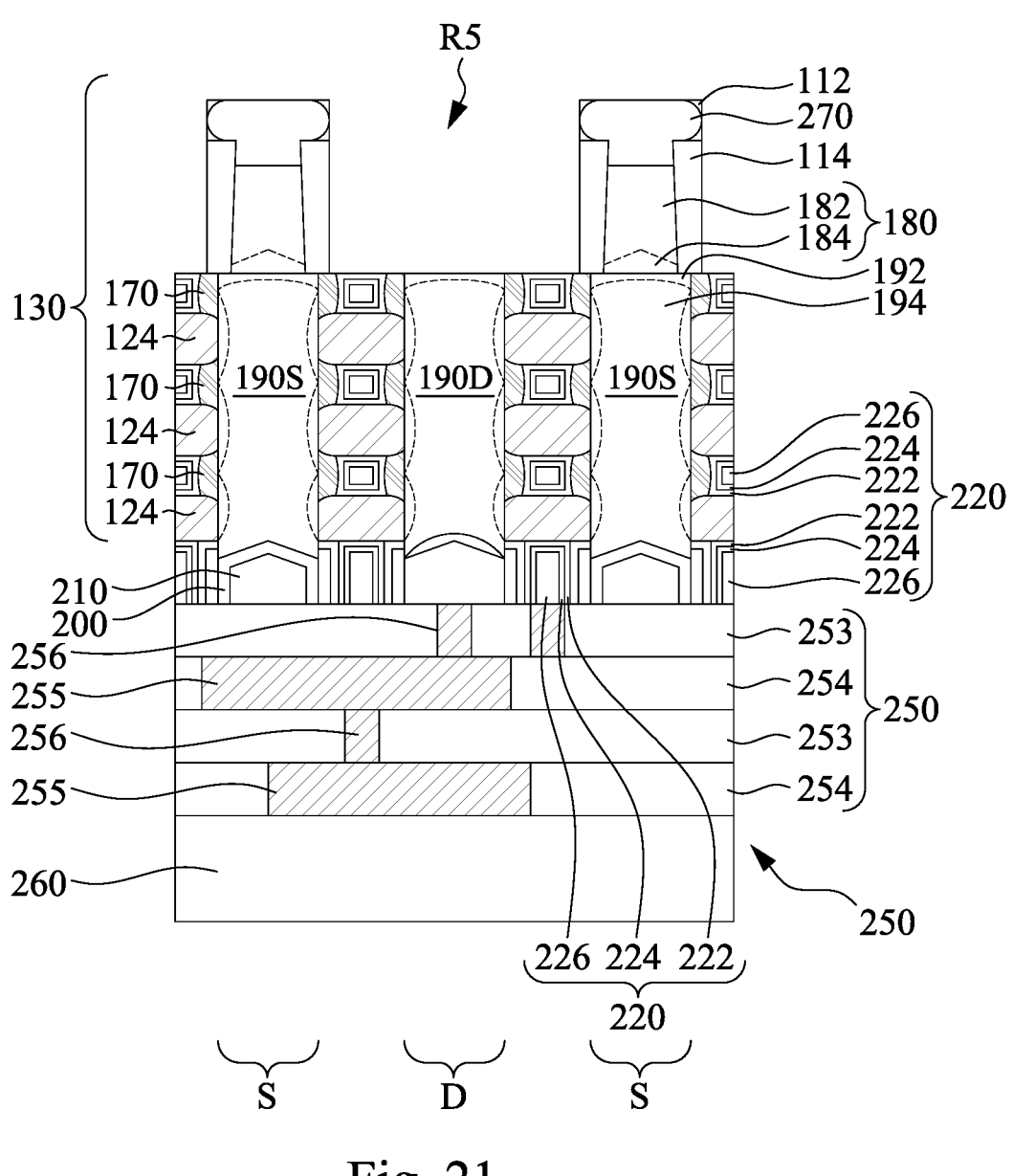

In FIG. 21, an etching process is performed on the backside surface of the substrate 110 by using the hard masks 270 as an etching mask, thus forming openings R5 between the hard masks 270. The etching process is a selective anisotropic etching process that etches the SiGe insertion layer 112 and the thick Si layer 114 at a much faster etching rate than etching the hard masks 270, and thus first regions of the SiGe insertion layer 112 and the thick Si layer 114 not covered by the hard masks 270 are removed, and second regions of the SiGe insertion layer 112 and the thick Si layer 114 directly below the hard masks 270 remain on backside surfaces of the source epitaxial structures 190S. In some embodiments, the selective anisotropic etching process is a plasma etching process using a plasma etchant generated from a gaseous mixture of a chlorine-based gas (e.g., e.g., $Cl_2$, $SiCl_4$, or the like) and an oxygen gas (02). The plasma etchant used in the step of FIG. 21 is different from the plasma etchant used in the previous step of FIG. 19, because the plasma etchant used in the step of FIG. 21 serves to etch both SiGe and Si, but the plasma etchant used in the previous step of FIG. 19 serves to mainly etch SiGe.

Figure 22:
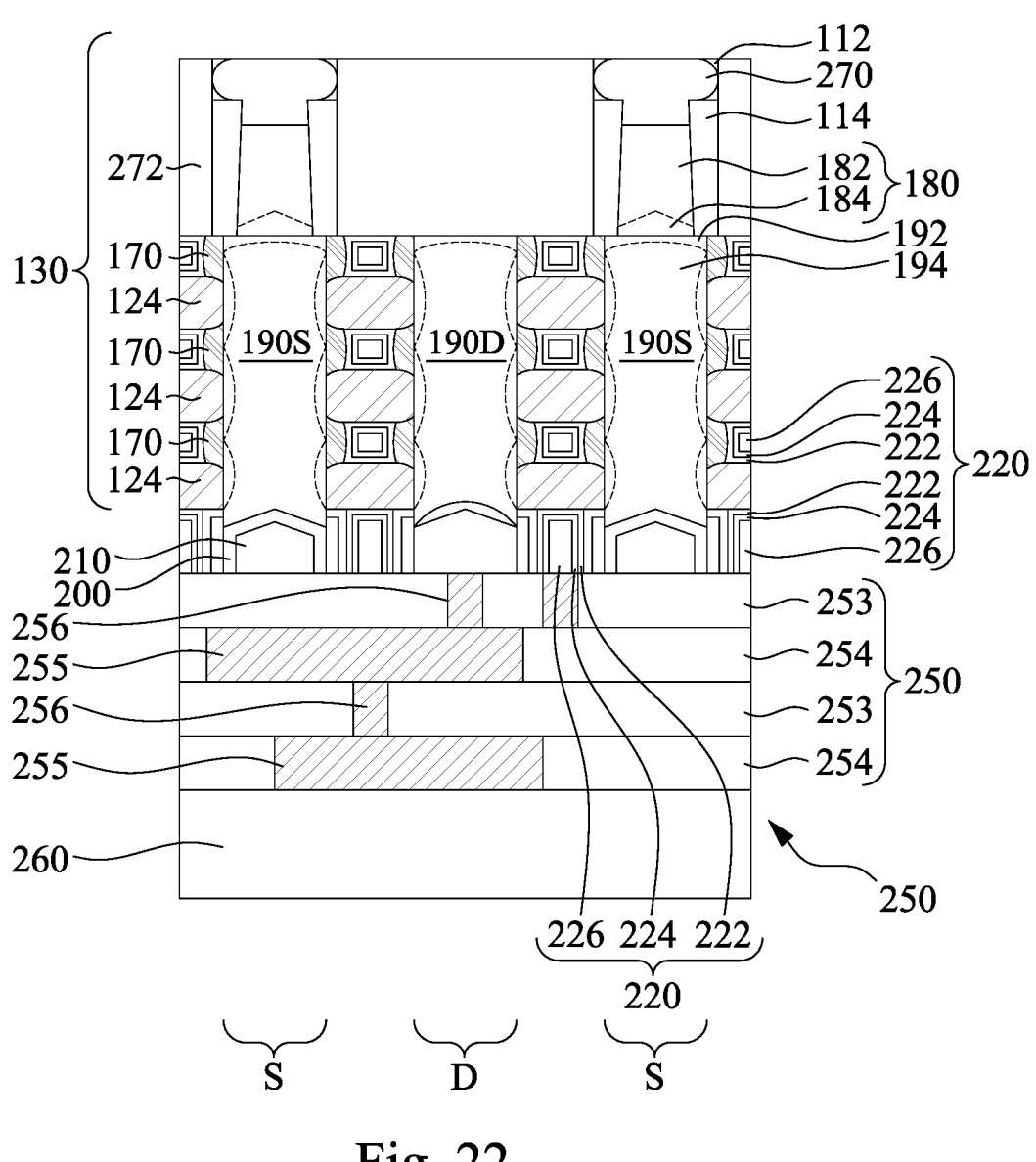

In FIG. 22, in some embodiments, a backside ILD layer 272 is formed in the openings R5. In some embodiments, a dielectric material of backside ILD layer 272 is first deposited overfilling the openings R5 by using suitable deposition techniques such as a flowable CVD. Subsequently, the deposited dielectric material is thinned down by using, for example, an etch back process, a CMP process or the like, until the hard masks 270 are exposed from the backside ILD layer 272. The ILD layer 272 is referred to as a "backside" ILD layer in this context because it is formed on a backside of the multi-gate transistors opposite to the front-side of the multi-gate transistors that replacement gates 220 protrude from source/drain regions 190S/190D.

The backside ILD layer 272 may be silicon oxide ($SiO_2$). In some embodiments, the backside ILD layer 272 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside ILD layer 272 has a same material as the front-side ILD layer 210.

Figure 23:
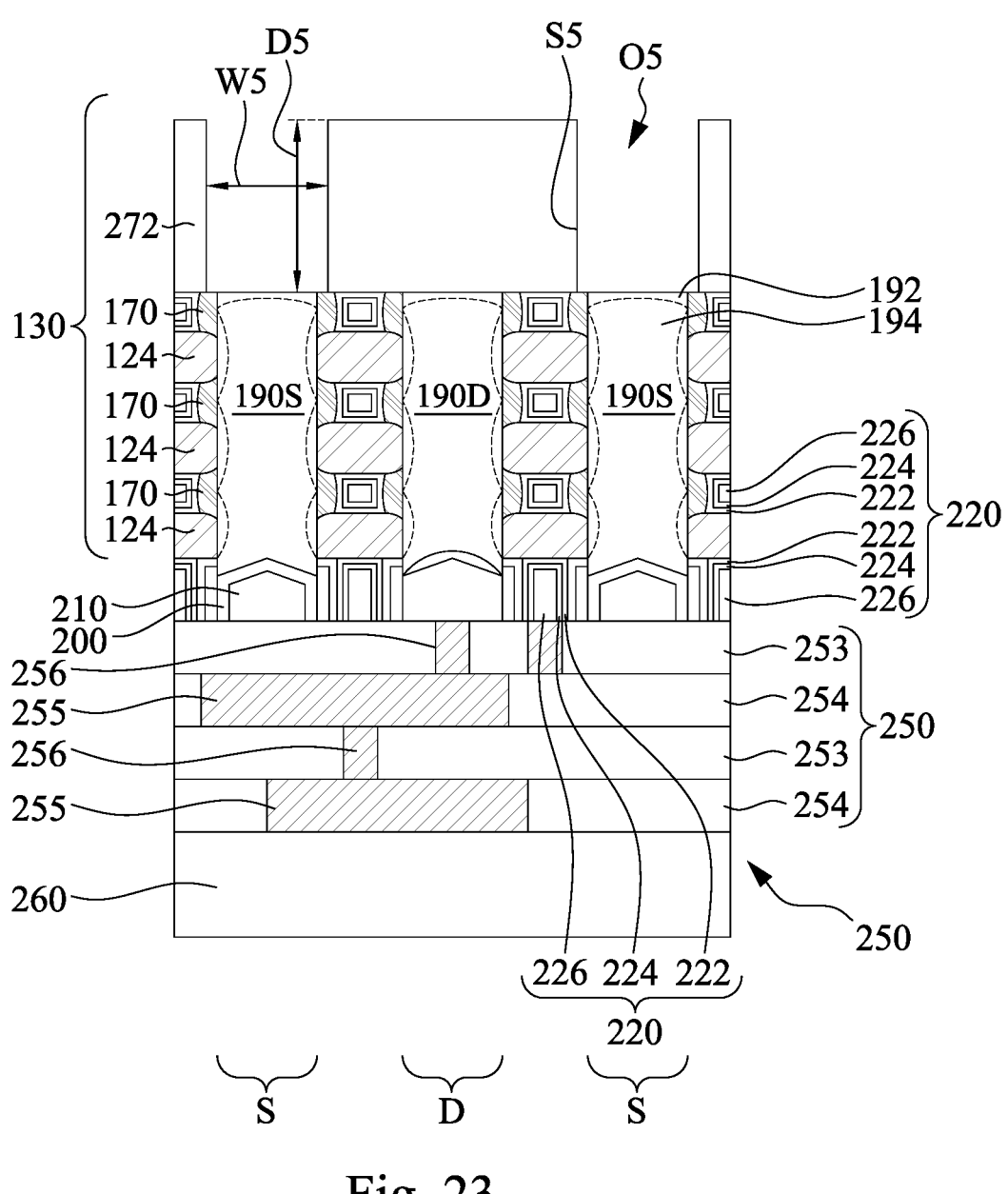

In FIG. 23, the hard masks 270, sacrificial epitaxial plugs 180, remaining portions of SiGe insertion layer 112 and thick Si layer 114 are removed to form backside via openings O5 extending through the backside ILD layer 272 to expose backsides of the source epitaxial structures 190S. In some embodiments, the backside via openings O5 are formed by using a two-step etching process including a hard mask removal etching step, followed by a semiconductor removal etching step. In some embodiments where the hard masks 270 are silicon nitride, the hard mask removal etching step for removing the hard masks 270 is a wet etching process using $H_3PO_4$ or other suitable etchants. In some embodiments, the semiconductor removal etching step for removing the sacrificial epitaxial plugs 180, remaining portions of SiGe insertion layer 112 and thick Si layer 114 is a plasma etching process using a plasma etchant generated from a gaseous mixture of a chlorine-based gas (e.g., e.g., $Cl_2$, $SiCl_4$, or the like) and an oxygen gas ($O_2$). In some embodiments, the semiconductor removal etching step for forming the backside via openings O5 uses a same etchant as that used in the previous step of forming openings R5 between hard masks 270 as illustrated FIG. 21.

In some embodiments, the backside via openings O5 each have a lateral dimension (i.e., width) W5 and a vertical dimension (i.e., depth) D5, wherein the lateral dimension W5 is in a range from about 20 nm to about 40 nm, and the vertical dimension D5 is in a range from about 20 nm to about 70 nm. In some embodiments, the lateral dimension W5 of the backside via opening O5 is larger than a lateral dimension (i.e., width) of the source epitaxial structure 190S, which in turn allows for an increased contact area between the source epitaxial structure 190S and a subsequently formed backside via. In particular, the backside via opening O5 have opposite sidewalls S5 laterally set back from opposite sidewalls 190SS of the source epitaxial structure 190S respectively by a non-zero offset dimension, and thus partial regions of top ones of inner spacers 170 are exposed by the backside via openings O5. The non-zero offset dimension is precisely controlled such that the gate structures 220 are not exposed in the backside via openings O5 to avoid unwanted electrical connection to the gate structures 220.

Figure 24:
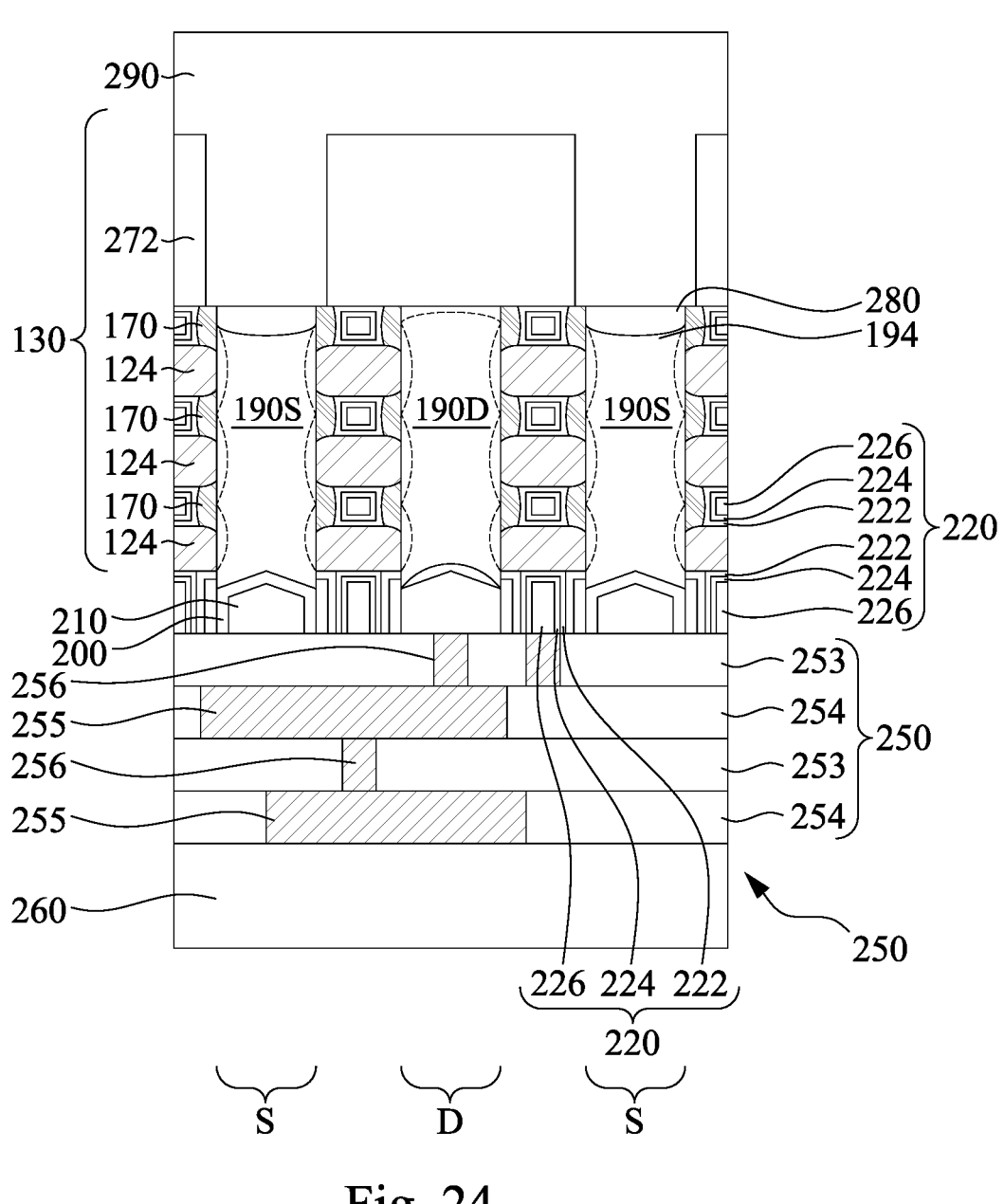

In FIG. 24, a source silicide region 280 is on the backside of each of the source epitaxial structures 190S by using a silicidation process, followed by depositing a metal material layer 290 over the source silicide regions 280. Silicidation may be formed by depositing a metal layer (e.g., nickel layer or cobalt layer) over the exposed backsides of source epitaxial structures 190S, annealing the metal layer such that the metal layer reacts with silicon (and germanium if present) in the source epitaxial structures 190S to form the metal silicide regions 280 (e.g., nickel silicide or cobalt silicide), and thereafter removing the non-reacted metal layer. Once formation of the source silicide regions 280 is complete, one or more metal materials (tungsten, cobalt, copper, the like or combinations thereof) are deposited to form a metal materiel layer 290 overfilling the backside via openings O5 by using suitable deposition techniques (e.g., CVD, PVD, ALD, the like or combinations thereof).

Figure 25:
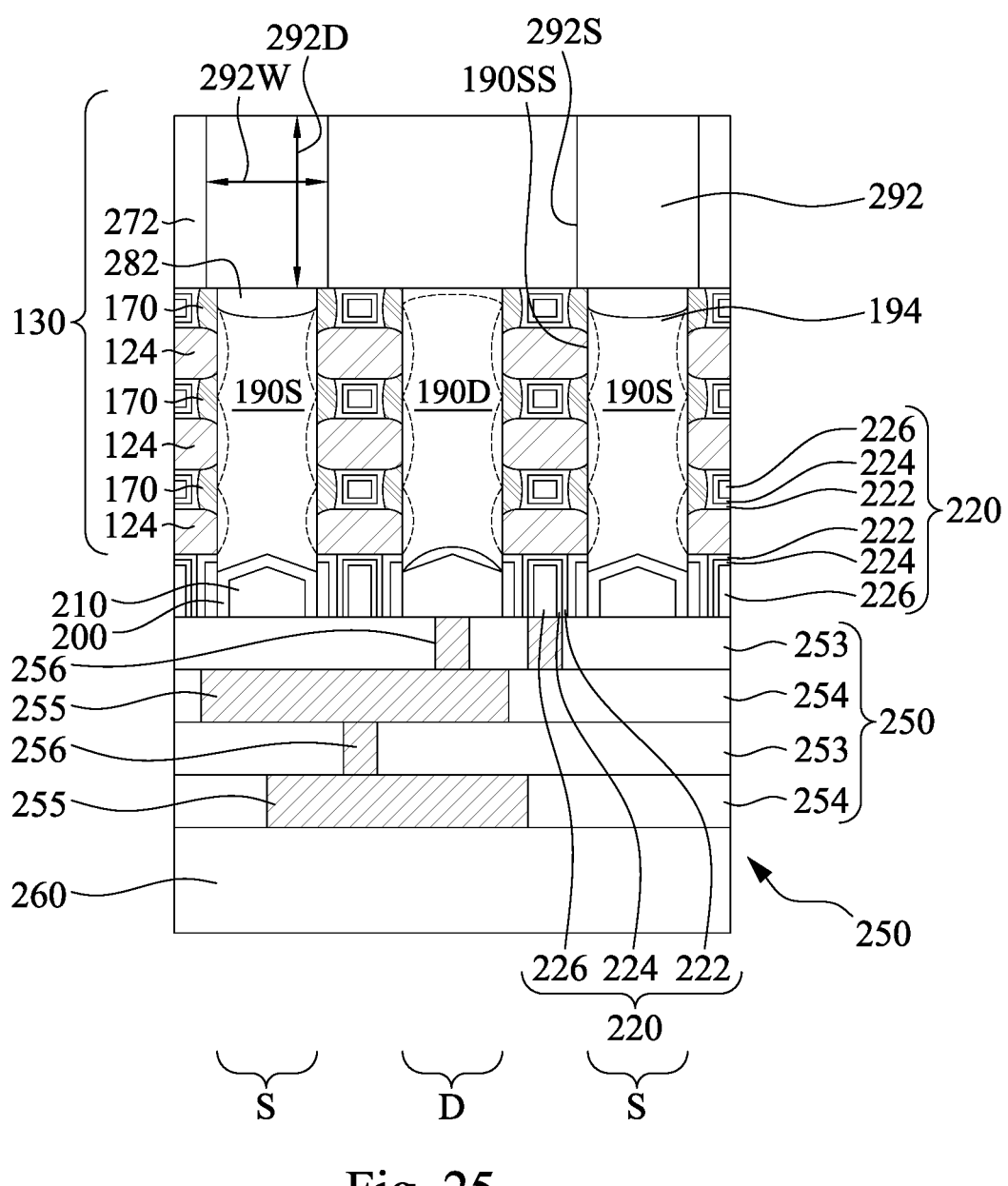

In FIG. 25, the metal material layer 290 is thinned down to form backside vias 292 in the backside via openings O5. In some embodiments, a CMP process is performed to thin down the metal material layer 290 (as illustrated in FIG. 24) until the backside ILD layer 270 is exposed, while leaving separate portions of the metal material 290 in the backside via openings O5 to serve as backside vias 292. Because the backside vias 292 fill up the respective backside via openings O5, the backside vias 292 inherit the geometry of the corresponding backside via openings O5. In particular, the backside vias 292 each have a lateral dimension (i.e., width) 292W and a vertical dimension (i.e., depth) 292D, wherein the lateral dimension 292W is in a range from about 20 nm to about 40 nm, and the vertical dimension 292D is in a range from about nm to about 70 nm. In some embodiments, the lateral dimension 292W of the backside via 292 is larger than a lateral dimension (i.e., width) of the source epitaxial structure 190S, which in turn allows for an increased contact area between the source epitaxial structure 190S and the backside via 292. In particular, the backside via 292 have opposite sidewalls 292S laterally set back from opposite sidewalls 190SS of the source epitaxial structure 190S respectively by a non-zero offset dimension, and thus partial regions of top ones of inner spacers 170 are in contact with the backside vias 292. The non-zero offset dimension is precisely controlled such that the backside vias 292 are separated from the gate structures 220 to avoid unwanted electrical connection between the source epitaxial structure 190S and the gate structure 220.

Figure 26:

In FIG. 26, a backside MLI structure 300 is formed over the backside vias 292 and the backside ILD layer 272. The backside MLI structure 300 may comprise a bottommost metallization layer 301 and a plurality of upper backside metallization layers 302 over the bottommost backside metallization layer 301. The number of upper backside metallization layers 302 may vary according to design specifications of the integrated circuit structure 100. Only two backside metallization layers 302 (also called backside M1 layer and backside M2 layer) are illustrated in FIG. 26 for the sake of simplicity.

The bottommost backside metallization layer 301 (also called backside M0 layer) comprises a backside IMD layer 303 over the backside ILD layer 270 and one or more horizontal interconnects, such as backside metal lines 305, respectively extending horizontally or lateralling in the backside IMD layer 303. A metal line 305 in the bottommost backside metallization layer 301 is a power rail that extends across and is in contact with one or more source backside vias 292, so as to make electrical connection to one or more source epitaxial structures 190S. Because the power rail is formed in the backside MLI structure 300, more routing space can be provided for the integrated circuit structure 100.

The backside metallization layers (e.g., backside M1 layer and M2 layer) 302 each comprise a first backside inter-metal dielectric (IMD) layer 304 and a second backside IMD layer 306. The second backside IMD layers 306 are formed over the corresponding first backside IMD layers 304. The backside metallization layers 302 comprise one or more horizontal interconnects, such as backside metal lines 307, respectively extending horizontally or laterally in the second backside IMD layers 306 and vertical interconnects, such as backside vias 308, respectively extending vertically in the first backside IMD layers 304. In some embodiments, the backside vias 308 have tapered profile (as indicated in dash lines) with a width decreasing as a distance from the backside ILD layer 272 decreases, due to the nature of etching via openings in the backside IMD layers 304 after the IC structure 100 is flipped upside down.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that larger contact area can be provided for the backside vias. Another advantage is that the backside via have lower resistance due to the increased lateral dimension of backside via. Another advantage is that RC time delay can be improved because of the increased contact area.

In some embodiments, a method includes forming a first semiconductor layer on a substrate; etching a first recess extending through the first semiconductor layer into the substrate; forming a sacrificial epitaxial plug in the first recess; forming source/drain epitaxial structures over the substrate, wherein a first one of the source/drain epitaxial structures is formed over the sacrificial epitaxial plug; forming a gate structure laterally between the source/drain epitaxial structures; etching a backside surface of the sacrificial epitaxial plug to form a second recess extending through the substrate into the first semiconductor layer, wherein a lateral dimension of the second recess is larger in the first semiconductor layer than in the substrate; forming a hard mask in the second recess; and replacing the hard mask and the sacrificial epitaxial plug with a backside via.

In some embodiments, a method includes etching a first recess in a substrate; forming a sacrificial epitaxial plug in the first recess in the substrate; forming source/drain epitaxial structures over the substrate, wherein a first one of the source/drain epitaxial structures is formed over the sacrificial epitaxial plug; forming a gate structure laterally between the source/drain epitaxial structures; and replacing the sacrificial epitaxial plug with a backside via, wherein the backside via is wider than the first one of the source/drain epitaxial structures.

In some embodiments, an IC structure includes a gate structure, source/drain epitaxial structures, a front-side interconnection structure, a backside dielectric layer, and a backside via. The source/drain epitaxial structures are respectively on opposite sides of the gate structure. The front-side interconnection structure is on front-sides of the source/drain epitaxial structures. The backside dielectric layer is on backsides of the source/drain epitaxial structures. The backside via extends through the backside dielectric layer to a first one of the source/drain epitaxial structures. The backside via has a lateral dimension larger than a lateral dimension of the first one of the source/drain epitaxial structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first semiconductor layer on a substrate;
etching a first recess extending through the first semiconductor layer into the substrate;
forming a sacrificial epitaxial plug in the first recess;
forming source/drain epitaxial structures over the substrate, wherein a first one of the source/drain epitaxial structures is formed over the sacrificial epitaxial plug;
forming a gate structure laterally between the source/drain epitaxial structures;
etching a backside surface of the sacrificial epitaxial plug to form a second recess extending through the substrate into the first semiconductor layer, wherein a lateral dimension of the second recess is larger in the first semiconductor layer than in the substrate;
forming a hard mask in the second recess; and
replacing the hard mask and the sacrificial epitaxial plug with a backside via.

2. The method of claim 1, wherein the first semiconductor layer is formed of a different material than the substrate.

3. The method of claim 1, wherein the first semiconductor layer is formed of a same material as the sacrificial epitaxial plug.

4. The method of claim 1, wherein the first semiconductor layer is silicon germanium.

5. The method of claim 1, further comprising:
forming a second semiconductor layer over the first semiconductor layer, wherein the second semiconductor layer is thicker than the first semiconductor layer, and the first recess extends through the second semiconductor layer.

6. The method of claim 5, wherein the second semiconductor layer is formed of a same material as the substrate.

7. The method of claim 1, wherein etching the backside surface of the sacrificial epitaxial plug is performed such that the backside surface of the sacrificial epitaxial plug is lower than a front-side surface of the first semiconductor layer.

8. The method of claim 1, wherein the lateral dimension of the second recess in the first semiconductor layer is larger than a lateral dimension of the first one of the source/drain epitaxial structures.

9. The method of claim 1, further comprising:
prior to replacing the hard mask and the sacrificial epitaxial plug with the backside via, forming a dielectric layer on a backside surface of a second one of the source/drain epitaxial structures.

10. The method of claim 1, further comprising:
forming a backside power rail on the backside via.

11. A method comprising:
forming a silicon germanium layer over a substrate;
forming a silicon layer over the silicon germanium layer;
etching a first recess through the silicon layer and the silicon germanium layer into the substrate;
forming a sacrificial epitaxial plug in the first recess in the substrate;
forming source/drain epitaxial structures over the substrate, wherein a first one of the source/drain epitaxial structures is formed over the sacrificial epitaxial plug;
forming a gate structure laterally between the source/drain epitaxial structures; and
replacing the sacrificial epitaxial plug with a backside via, wherein the backside via is wider than the first one of the source/drain epitaxial structures, wherein replacing the sacrificial epitaxial plug with the backside via comprises:
etching a backside surface of the sacrificial epitaxial plug to form a second recess extending through the substrate into the silicon germanium layer, wherein the second recess has a trapezoidal profile and laterally protruding profiles extending from opposite legs of the trapezoidal profile in to the silicon germanium layer;
forming a hard mask in the second recess;
etching an opening in the substrate, the silicon germanium layer, and the silicon layer by using the hard mask as an etching mask;
forming a dielectric layer in the opening;
removing the hard mask and the sacrificial epitaxial plug to form a backside via opening in the dielectric layer; and
forming the backside via in the backside via opening.

12. The method of claim 11, wherein the sacrificial epitaxial plug is formed interfacing the silicon layer and the silicon germanium layer.

13. The method of claim 11, wherein the sacrificial epitaxial plug comprises a first silicon germanium layer, and a second silicon germanium layer over the first silicon germanium layer, and the second silicon germanium layer has a lower germanium atomic concentration than the first silicon germanium layer.

14. A method comprising:

forming a first semiconductor layer over a substrate;

forming source/drain epitaxial structures over the first semiconductor layer and respectively on opposite sides of a gate structure;

forming a front-side interconnection structure over front-sides of the source/drain epitaxial structures;

forming a backside dielectric layer over backsides of the source/drain epitaxial structures; and forming a backside via extending through the backside dielectric layer to a first one of the source/drain epitaxial structures, wherein the backside via has a lateral dimension larger than a lateral dimension of the first one of the source/drain epitaxial structures, wherein forming the backside via comprises:

etching a first recess extending through the first semiconductor layer into the substrate;

forming a sacrificial epitaxial plug in the first recess;

etching a backside surface of the sacrificial epitaxial plug to form a second recess extending through the substrate into the first semiconductor layer, wherein a lateral dimension of the second recess is larger in the first semiconductor layer than in the substrate;

forming a hard mask in the second recess; and replacing the hard mask and the sacrificial epitaxial plug with the backside via.

15. The method of claim 14, further comprising:

forming a plurality of channel layers arranged one above another in a spaced apart manner, one or more of the plurality of channel layers being surrounded by the gate structure.

16. The method of claim 15, further comprising:

forming a plurality of inner spacers alternating with the plurality of channel layers, the plurality of inner spacers spacing the gate structure apart from the source/drain epitaxial structures.

17. The method of claim 16, wherein one of the plurality of inner spacers is in contact with the backside via.

18. The method of claim 14, wherein an entirety of the backside of a second one of the source/drain epitaxial structures is covered by the backside dielectric layer in a cross-sectional view.

19. The method of claim 14, wherein the second recess has a trapezoidal profile and protruding profiles laterally extending from opposite legs of the trapezoidal profile.

20. The method of claim 14, further comprising:

forming a metal silicide region on the backside of the first one of the source/drain epitaxial structures.

\* \* \* \* \*